(12) United States Patent
Xia et al.

(10) Patent No.: US 10,886,455 B2
(45) Date of Patent: Jan. 5, 2021

(54) PIEZOELECTRIC MICROPHONE WITH DEFLECTION CONTROL AND METHOD OF MAKING THE SAME

(71) Applicant: VANGUARD INTERNATIONAL SEMICONDUCTOR SINGAPORE PTE. LTD., Singapore (SG)

(72) Inventors: Jia Jie Xia, Singapore (SG); Rakesh Kumar, Singapore (SG); Minu Prabhachandran Nair, Singapore (SG); Nagarajan Ranganathan, Singapore (SG)

(73) Assignee: VANGUARD INTERNATIONAL SEMICONDUCTOR SINGAPORE PTE. LTD., Singapore (SG)

( * ) Notice: Subject to any disclaimer, the term of this patent is extended or adjusted under 35 U.S.C. 154(b) by 665 days.

(21) Appl. No.: 15/664,784

(22) Filed: Jul. 31, 2017

(65) Prior Publication Data
US 2019/0036003 A1    Jan. 31, 2019

(51) Int. Cl.
*H01L 41/113* (2006.01)
*H04R 17/02* (2006.01)
(Continued)

(52) U.S. Cl.
CPC .......... *H01L 41/1132* (2013.01); *B81B 3/001* (2013.01); *H01L 41/0477* (2013.01);
(Continued)

(58) Field of Classification Search
CPC ............. H01L 41/1132; H01L 41/0477; H01L 41/0533; H01L 41/1138; H01L 41/0805; H04R 17/02
(Continued)

(56) References Cited

U.S. PATENT DOCUMENTS 8,531,088 B2    9/2013  Grosh et al.
2012/0250909 A1  10/2012 Grosh et al.
(Continued)

FOREIGN PATENT DOCUMENTS

TW    201334576 A1    8/2013

OTHER PUBLICATIONS

Office Action for the related Taiwanese Patent Application No. 106145059, dated Oct. 26, 2018, 8 pages.

*Primary Examiner* — Derek J Rosenau
(74) *Attorney, Agent, or Firm* — Winston Hsu

(57) ABSTRACT

A method of forming a piezoelectric microphone with an interlock/stopper and a micro-bump and a resulting device are provided. Embodiments include forming a membrane over a Si substrate having a first and second sacrificial layer disposed on opposite surfaces thereof, the membrane being formed on the first sacrificial layer, forming a first HM over the membrane, forming first and second vias through the first HM, forming a first pad layer in the first and second vias and over an exposed top thin film, forming a trench to the first sacrificial layer between the first and second vias and a gap between the trench and second via, patterning a second HM over the membrane, in the first and second vias, the trench and the gap, and forming a second pad layer over the second HM and in exposed areas around the first and second vias to form pad structures.

5 Claims, 25 Drawing Sheets

(51) Int. Cl.
- *H01L 41/053* (2006.01)
- *H01L 41/332* (2013.01)
- *H01L 41/047* (2006.01)
- *H01L 41/08* (2006.01)
- *H01L 41/29* (2013.01)
- *B81B 3/00* (2006.01)
- *H04R 31/00* (2006.01)

(52) U.S. Cl.
CPC ...... *H01L 41/0533* (2013.01); *H01L 41/0805* (2013.01); *H01L 41/1138* (2013.01); *H01L 41/29* (2013.01); *H01L 41/332* (2013.01); *H04R 17/02* (2013.01); *B81B 2201/0257* (2013.01); *H04R 31/00* (2013.01); *H04R 2201/003* (2013.01)

(58) Field of Classification Search
USPC .......................................... 381/114, 150, 190
See application file for complete search history.

(56) References Cited

U.S. PATENT DOCUMENTS

| | | | |
|---|---|---|---|
| 2014/0050338 A1* | 2/2014 | Kasai | H04R 31/006 381/174 |
| 2014/0053650 A1 | 2/2014 | Hall et al. | |
| 2014/0084395 A1 | 3/2014 | Sparks et al. | |
| 2014/0339657 A1 | 11/2014 | Grosh et al. | |
| 2015/0215706 A1 | 7/2015 | Sparks et al. | |
| 2018/0029882 A1* | 2/2018 | Cheng | B81C 1/00246 |

* cited by examiner

PIEZOELECTRIC MICROPHONE WITH DEFLECTION CONTROL AND METHOD OF MAKING THE SAME

TECHNICAL FIELD

The present disclosure relates to semiconductor fabrication and to the resulting device. In particular, the present disclosure relates to a piezoelectric microphone with deflection control and stiction prevention.

BACKGROUND

A piezoelectric microphone is a device that senses audio vibrations through contact with solid objects and is insensitive to air. Piezoelectric microphones can be used as acoustic leakage probes and with aeroacoustic tests, as well as with many other uses not confined to air.

Referring to FIG. 1, a conventional piezoelectric microphone is formed of a membrane 101 having a solid aluminum copper (AlCu) seal ring and cap structure 103, a trench 105 through the middle of the membrane 101, a bond pad 107 and a bridge 109 extending from the membrane 101 on a first side of the trench 105 and hanging over the membrane 101 on the second side of the trench 105. The seal ring and cap structure 103, bond pad 107 and bridge 109 are formed of solid AlCu. Also, potential stiction tends to exist during operation. Further, several hardmasks are required to achieve a desired gap thickness between the bridge 109 and the membrane 101.

A need therefore exists for methodology enabling formation of a piezoelectric microphone that can control released device deflection mismatch to be less than a gap thickness between a membrane and a bridge, to prevent potential stiction of the bridge and membrane, and to reduce the number of hardmasks required to obtain a target gap thickness between the bridge and the membrane, and a resulting device.

SUMMARY

An aspect of the present disclosure is a process of forming a piezoelectric microphone with control of released deflection mismatch to be less than a gap thickness between a membrane and an interlock/stopper.

Another aspect of the present disclosure is a process of forming a piezoelectric microphone that prevents potential stiction.

Another aspect of the present disclosure is a process of forming a piezoelectric microphone with fewer hardmasks.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a membrane over a silicon (Si) substrate having a first and second sacrificial layer disposed on opposite surfaces thereof, the membrane being formed on the first sacrificial layer; forming a first hardmask (HM) over the membrane; forming first and second vias through the first HM and partially through the membrane such that a portion of a top metal thin film surrounding each via is exposed; forming a first pad layer in the first and second vias and over the exposed top metal thin film; forming a trench to the first sacrificial layer between the first and second vias and a gap between the trench and second via; patterning a second HM over the membrane, in the first and second vias, the trench and the gap and to expose areas of the first pad layer around the first and second vias; and forming a second pad layer over the second HM and in the exposed areas around the first and second vias to form pad structures.

Aspects of the present disclosure include forming the membrane by: forming a seed layer over the first sacrificial layer; patterning a bottom metal thin film over the seed layer; patterning a middle metal thin film over a first device layer; forming the top metal thin film over a second device layer; and forming a passivation layer over the top metal thin film.

Other aspects include patterning a second HM by planarizing the HM to a thickness of 100 nm to 1000 nm and then etching the HM to form the second gap and to expose the areas of the first pad layer around the first and second vias. Further aspects include patterning the second HM to form a second gap between the first via and the trench extending down to the top thin film such that the second pad layer is also formed in the second gap to form an interlock/stopper structure that extends from the gap and over the trench and a portion of the membrane. Additional aspects include forming a HM over the second pad layer to a thickness of 1 μm to 5 μm; removing the second sacrificial layer from the Si substrate; and forming a second trench through a middle of the Si substrate and through part of the first sacrificial layer below the first trench. Still other aspects include removing all the HM by a process of vapor hydrofluoric acid (VHF) etching. Other aspects include forming the second pad layer by patterning the second pad layer and then etching the second pad layer down to the second HM. Still other aspects include forming the seed layer of aluminum nitride (AlN), forming the metal thin films of molybdenum (Mo), titanium (Ti), platinum (Pt), aluminum (Al), etc., the seed layer having a thickness of 20 nanometers (nm) to 200 nm, the metal thin films having a thickness of 20 nm to 200 nm, first and second device layers having a thickness of 100 nm to 1000 nm, and the passivation layer having a thickness of 20 nm to 200 nm.

Another aspect of the present disclosure includes a method including forming a membrane on a sacrificial layer covering a Si substrate; forming a first HM over the membrane; forming first and second vias through the first HM and partially through the membrane, a gap and an area around the first and second vias, the gap and areas around the first and second vias extending through the first HM to the membrane; patterning a first pad layer in the first and second vias and over the areas formed around the vias and to form a bump structure in the gap; forming a trench through the membrane to the first sacrificial layer between the first via and the bump structure; patterning a second HM across the membrane in the first and second vias, the trench and over the bump structure such that portions of the first pad layer around the first and second vias are exposed; and forming a second pad layer over the exposed portions of the first pad layer to form pad structures.

Aspects include the first pad layer is formed to a thickness of 0.1 μm to 0.2 μm, the bump structure is formed to a thickness of 0.1 μm to 0.2 μm, and the second pad layer is formed to a thickness of 200 nm to 2000 nm. Still other aspects include the forming the trench through the membrane between the first via and the first gap further includes forming a second gap between the first gap and the second via extending through a top metal thin film of the membrane.

Other aspects include patterning the second HM to also form a second gap between the first via and the trench, and forming the second pad layer in the second gap to form an interlock/stopper structure that extends from the second gap and over the bump structure. Other aspects include patterning the second HM by planarization to 0.1 µm to 0.5 µm in height and then etched to expose the portions of the first pad layer around the first and second vias.

Another aspect of the present disclosure includes a device including a Si layer and a sacrificial oxide layer on one side of the Si layer and a membrane having a seed layer and metal thin films and a passivation layer and a trench through the middle thereof; first and second seal ring and cap structures extending into the membrane and separated by a predetermined distance; a trench extending through the membrane between the first and second seal structures; a bond pad adjacent to and in contact with the second seal ring and cap structure; and an interlock/stopper extending from the membrane between the trench and the first seal ring and cap structure, over the trench and over a portion of the membrane.

Other aspects include the portion of the interlock/stopper extending over the membrane being separated from the membrane by a gap of 0.1 µm to 0.5 µm. Further aspects include a bump structure extending from the membrane and disposed under the interlock/stopper structure between the trench and the second seal ring and cap structure. Yet other aspects include the first seal ring and cap structures extending through the passivation layer, a third metal thin film and a first section of a second metal thin film to contact a first section of a first metal thin film, the seal ring and cap structure having an oxide disposed therein, and the second seal ring and cap structure extends through the passivation layer and the third metal thin film to extend to a third section of the second metal thin film. Still other aspects include the first and second seal ring and cap structures are formed to a thickness of 200 nm to 2000 nm and are formed of AlCu, and the bump structure is formed of AlCu and has a thickness of 0.1 µm to 0.2 µm.

Another aspect of the present disclosure includes a structure including a method including: providing a membrane with a passivation layer on a seed layer and metal thin films and having vias formed, the method including: patterning a first hardmask over the membrane to expose first and second vias and areas of a top metal thin film around the first and second vias; forming a first pad layer in the first and second vias and on the exposed areas of the top metal thin film; forming a trench between the first and second vias to divide the membrane into first and second sections and a gap between the trench and second via to break the top metal thin film; patterning a second hardmask across the membrane and in the first and second vias, in the trench and in the gap; and forming a second pad layer to form a first seal ring and cap structure over the first via and second seal ring and cap structure over the second via, and a bond pad in contact with the second seal ring and cap structure.

Other aspects include wherein the patterning of the second hardmask forms a second gap on the first section of the membrane between the first via and the trench to expose the top metal thin film and the second pad layer also forms an interlock/stopper structure that extends from the second gap and over the trench and a portion of the second section of the membrane. Still other aspects include during the patterning of the first hardmask, exposing a third gap that extends to the top metal thin film, and the first pad layer is formed with a bump pattern in the third gap to form a bump structure to sit below under the portion of the interlock/stopper structure extending over the second section of the membrane. Yet other aspects include wherein the second hardmask is formed to be 0.1 µm to 0.5 µm. Further aspects include the first pad layer and bump structure being formed to have a thickness of 0.1 µm to 0.2 µm. Other aspects include the second pad layer being formed to a thickness of 200 nm to 2000 nm.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of limited control of a piezoelectric microphone attendant upon released device deflection mismatch in a gap between a bridge and a membrane thereof. The present disclosure also addresses and solves the current problem of preventing stiction from occurring with a bridge and membrane thereof. In accordance with embodiments of the present disclosure, a piezoelectric microphone is formed with an interlock/stopper structure on top of a membrane. Also in accordance with an embodiment of the present disclosure, a piezoelectric microphone can be formed with a micro-bump structure underneath an interlock/stopper. Also in accordance with an embodiment of the present disclosure, a piezoelectric microphone can be formed using fewer hardmasks to target a gap thickness between a bridge and a membrane thereof.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 22:
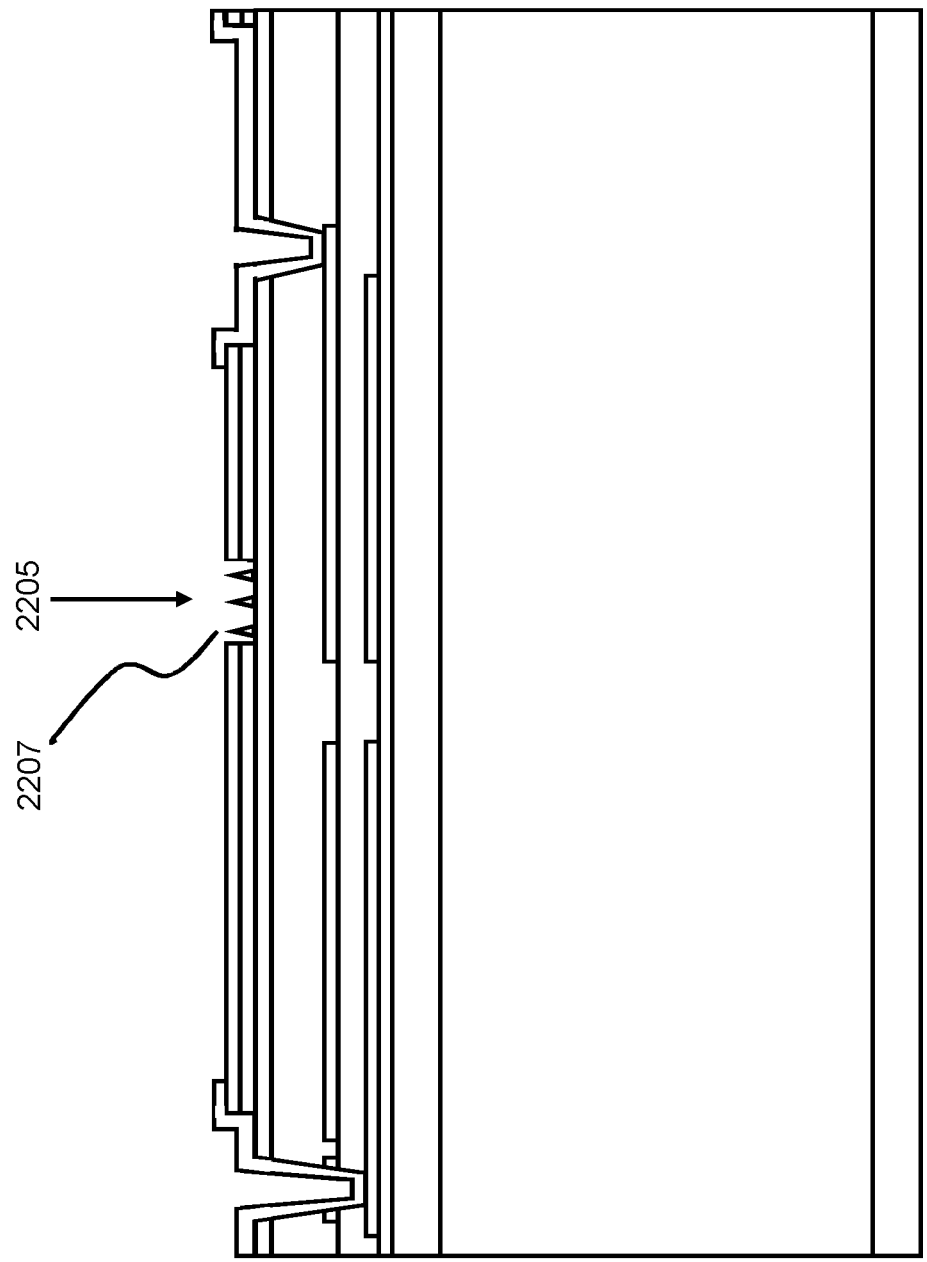
FIGS. 22 and 23 schematically illustrate cross-sectional views of fabrication process steps for a piezoelectric microphone device in accordance with another exemplary embodiment.
Figure 23:
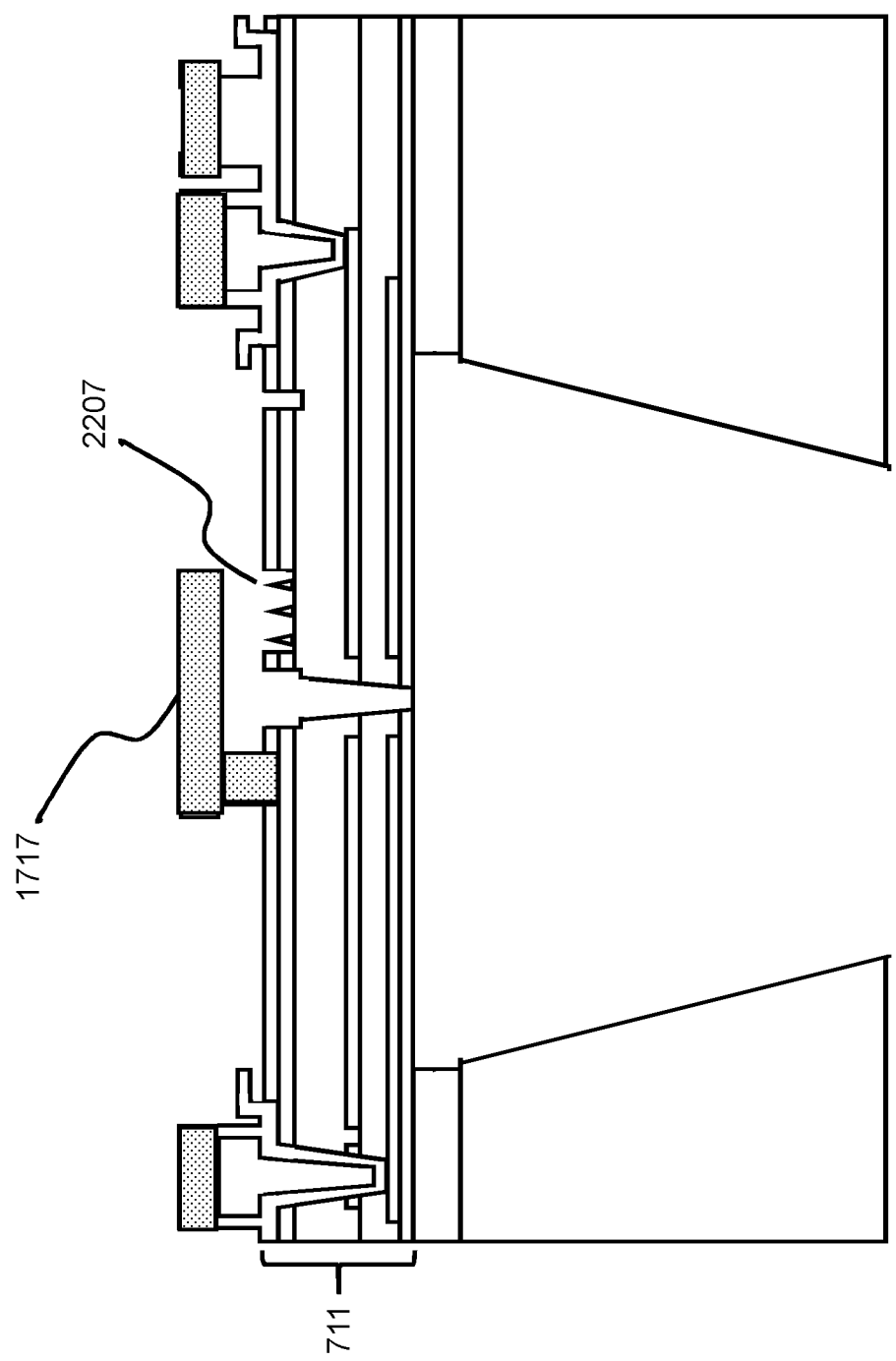

FIGS. 2 through 21 schematically illustrate cross-sectional views of a process flow for forming a piezoelectric microphone device with an interlock/stopper structure above a membrane, in accordance with an exemplary embodiment. FIGS. 22 and 23 schematically illustrate cross-sectional views of a process flow for forming a piezoelectric microphone with an interlock/stopper structure above a membrane and a micro bump structure on the membrane under the interlock/stopper, in accordance with another exemplary embodiment of the present disclosure.

Figure 1:
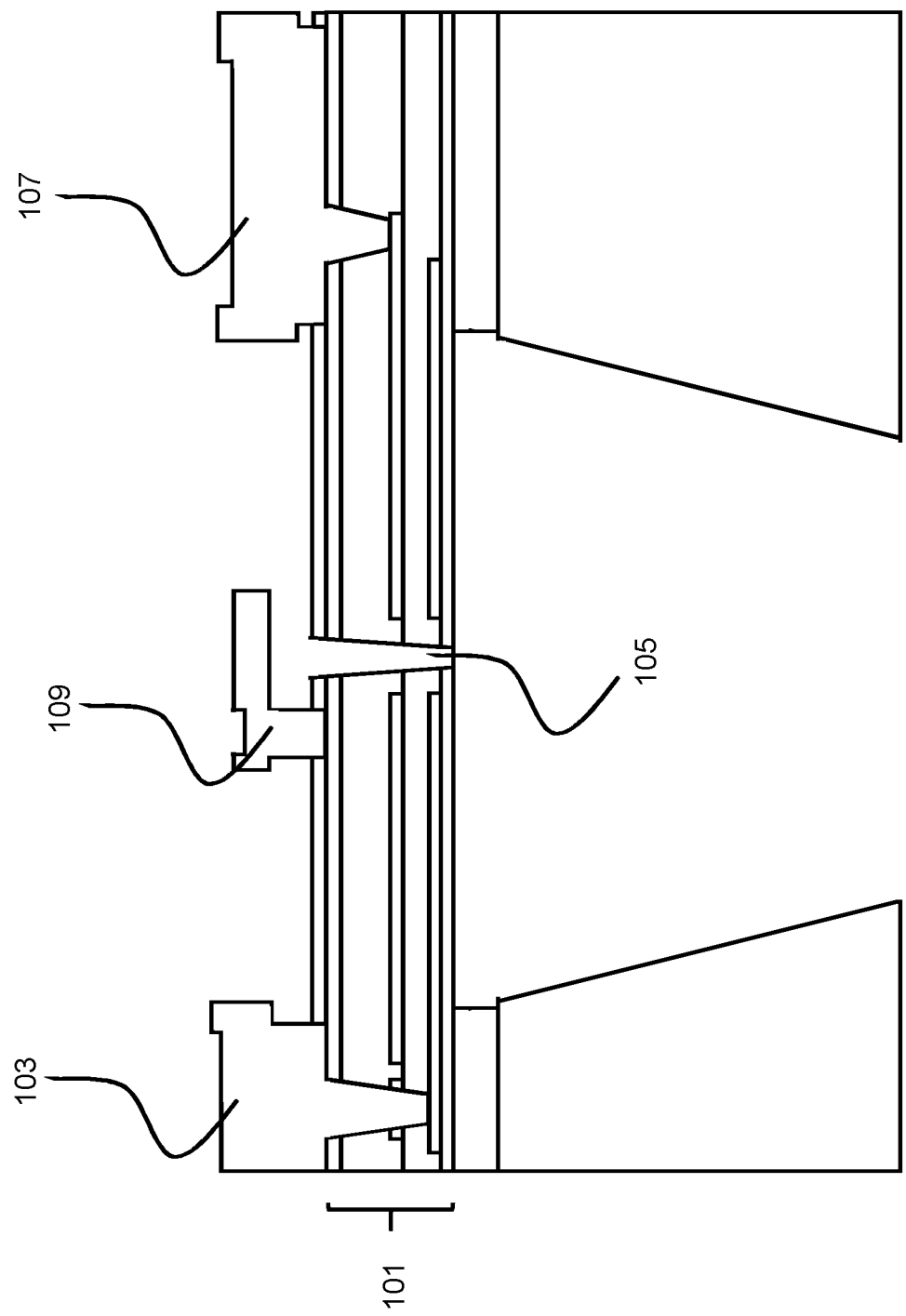
FIG. 1 schematically illustrates a cross-sectional view of a conventional piezoelectric microphone.
Figure 2:
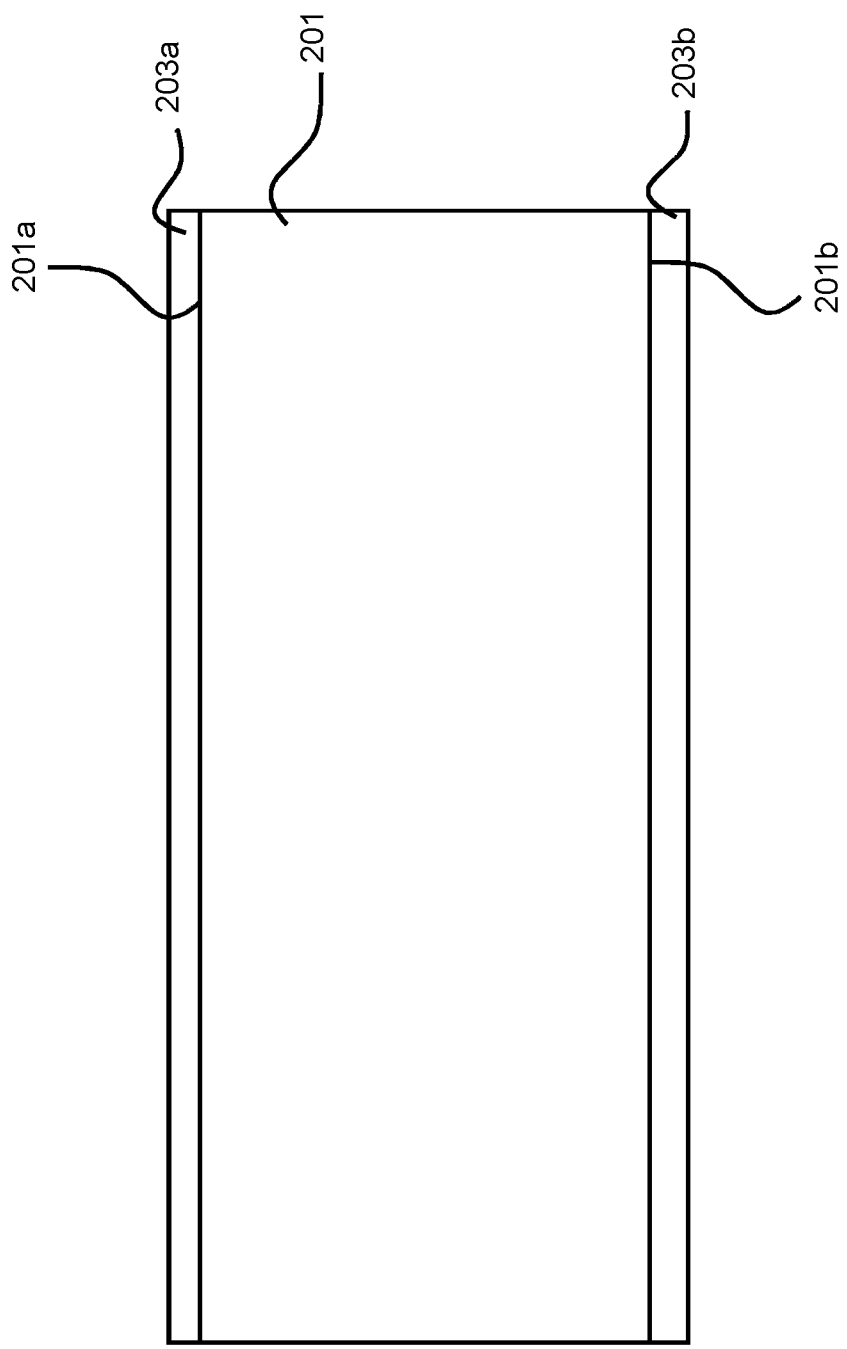
FIGS. 2 through 21 schematically illustrate cross-sectional views of fabrication process steps for a piezoelectric microphone device in accordance with an exemplary embodiment.

As illustrated in FIG. 2, a silicon (Si) layer 201 is provided with a sacrificial layer 203a formed on a front side 201a and a sacrificial layer 203b formed on a back side 201b thereof. The sacrificial layers 203a and 203b may be formed of an oxide formed to a thickness of 0.5 micrometers (µm) to 5 µm. Further, the sacrificial layers 203a and 203b may be formed, for example, by oxidation or by a plasma enhanced chemical vapor deposition (PECVD) process.

Figure 3:
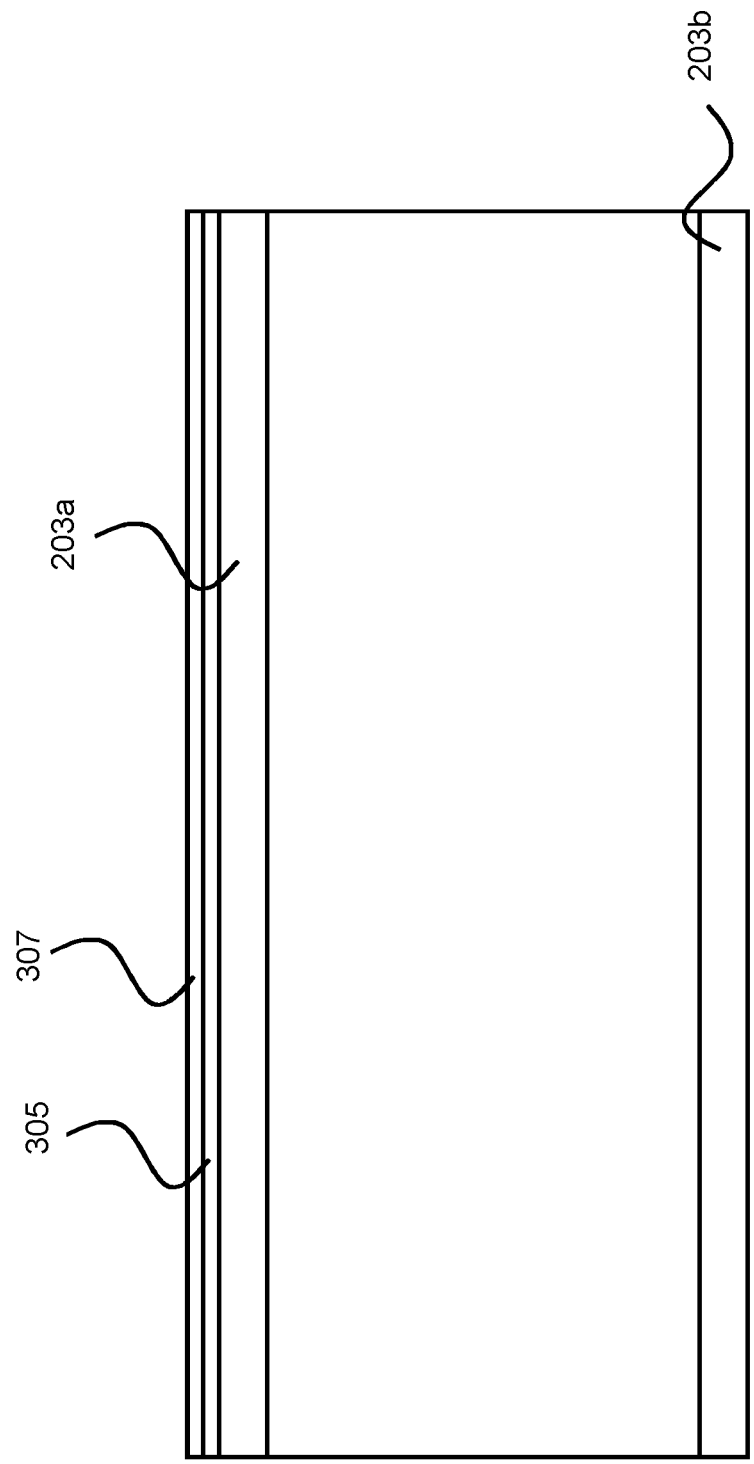

Adverting to FIG. 3, a seed layer 305 can be formed on the oxide layer 203a on the front side 201a of the silicon (Si) layer 201. The seed layer 305 can be formed of, for example, aluminum nitride (AlN). The seed layer 305 is formed to a thickness of 20 nanometers (nm) to 200 nm. The seed layer 305 may be formed, for example, by a sputtering deposition process. A first metal thin film 307 can be formed on the seed layer 305 to a thickness of 20 nm to 200 nm. The first metal thin film 307 may be formed of, for example, Mo, Ti, Pt, or Al, and may be applied by a sputtering or a physical vapor deposition (PVD) process.

Figure 4:
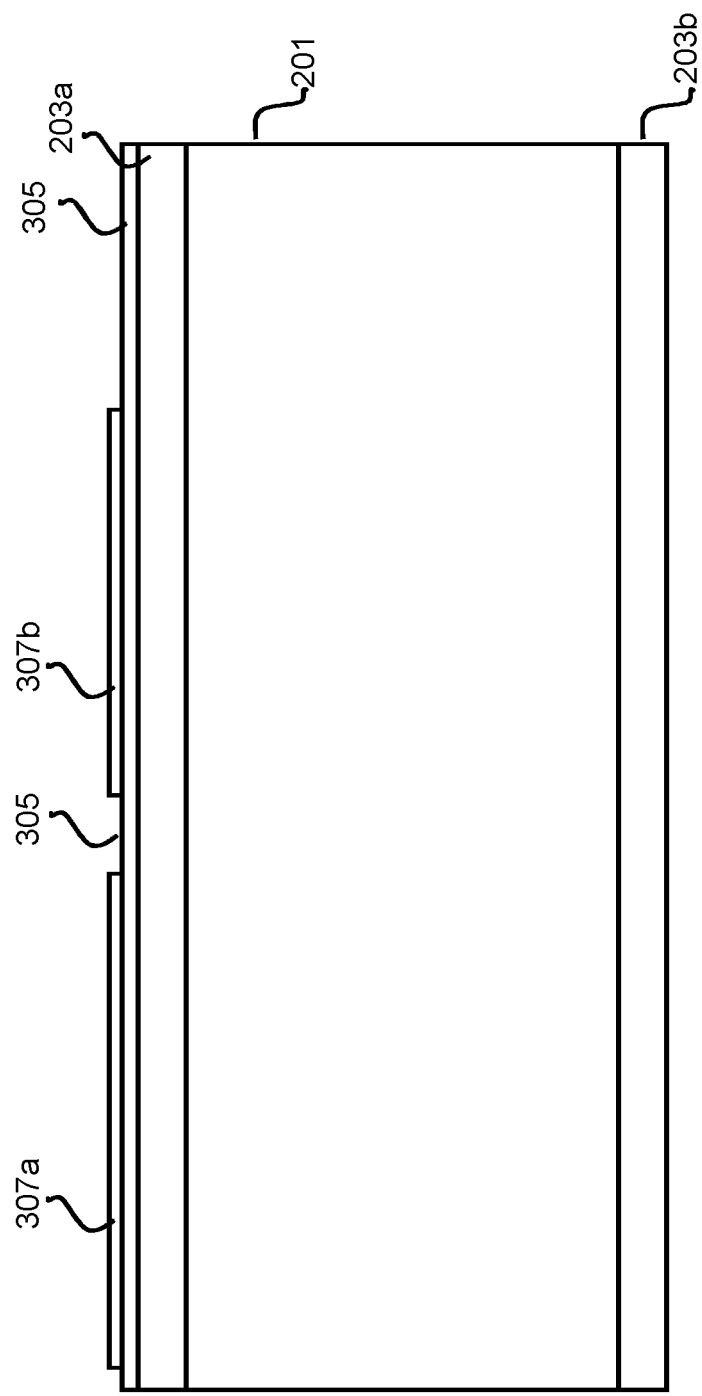

As illustrated in FIG. 4, the first metal thin film 307 can be patterned to form a first metal thin film section 307a and a second metal thin film section 307b. The first metal thin film section 307a and second thin film section 307b will act as a bottom electrode.

Figure 5:
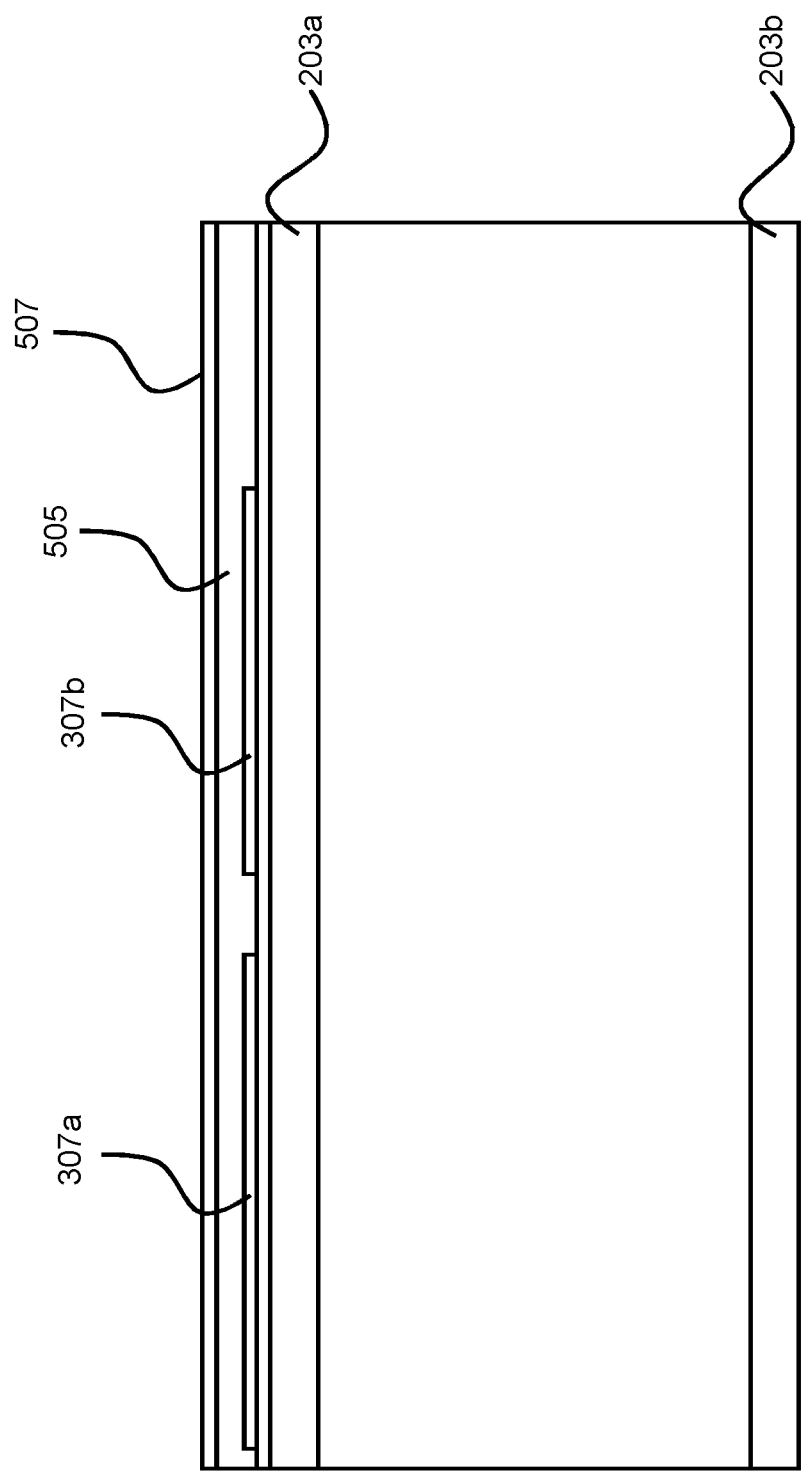

As illustrated in FIG. 5, a first device layer 505 can be formed over the first metal thin film section 307a and the second metal thin film section 307b. The first device layer 505 is formed to a thickness of 100 nm to 1000 nm. The first device layer 505 may be formed, for example, by a sputtering or physical vapor deposition process. A second metal thin film 507 is deposited on the first device layer 505.

Figure 6:
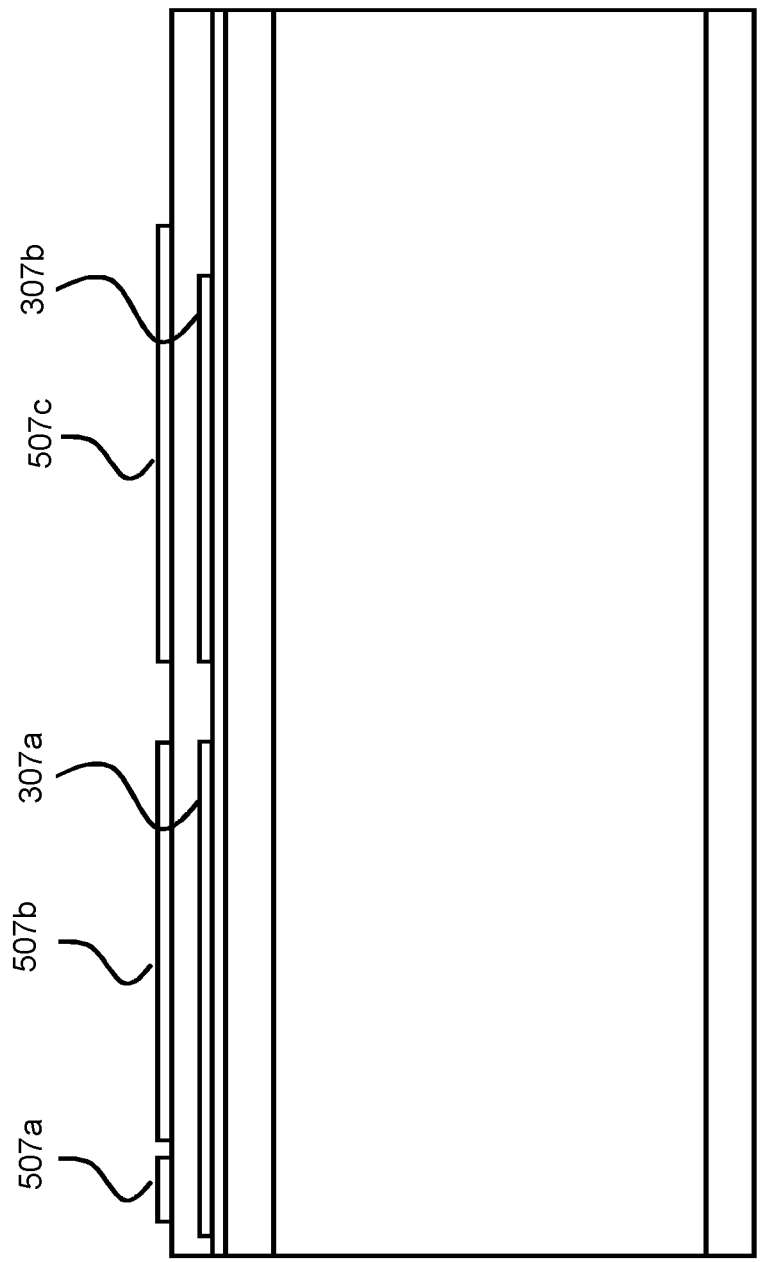

As illustrated in FIG. 6, the second metal thin film 507 can be patterned to form a first metal thin film section 507a, a second metal thin film section 507b and a third metal thin film section 507c. The second metal thin film 507 can be patterned, for example, by an etching process. The remaining pattern of the second metal thin film 507, including metal thin film sections 507a, 507b and 507c, will act as a middle electrode.

Figure 7:
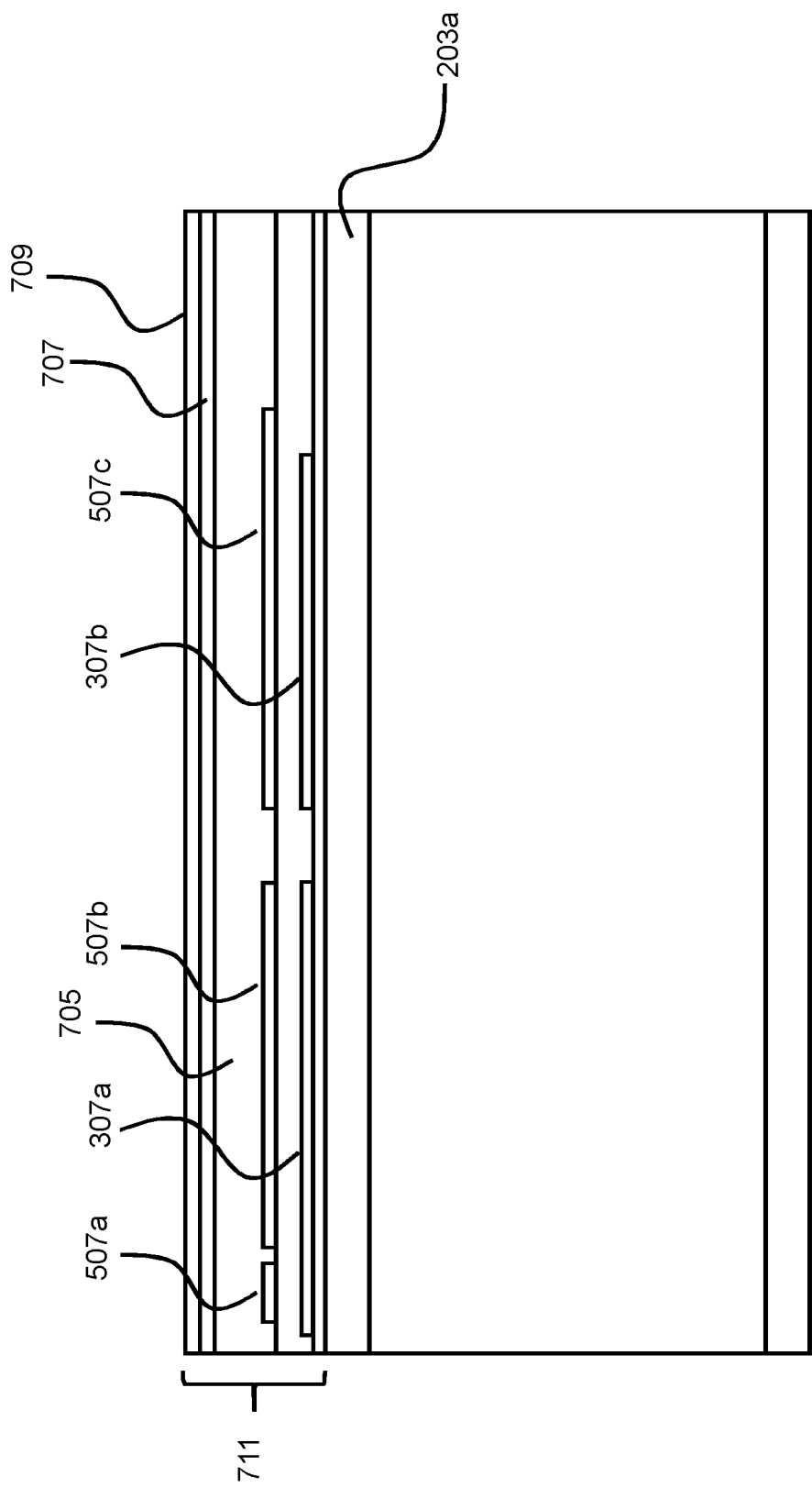

As illustrated in FIG. 7, a second device layer 705 can be formed over the metal thin film sections 507a, 507b and 507c. The second device layer 705 is formed to a thickness of 100 nm to 1000 nm. The second device layer 705 may be formed, for example, by a sputtering or physical vapor deposition process. A third metal thin film 707 can be formed on the second device layer 705 to a thickness of 20 nm to 200 nm, followed by a passivation layer 709 formed on the third metal thin film 707. The passivation layer 709 can be formed of, for example, AlN. The second device layer 705, the third metal thin film 707 and the passivation layer 709 can be formed, for example, by atomic layer deposition or a sputtering process. The seed layer, metal thin films, device layers, and passivation layer form membrane 711.

Figure 8:
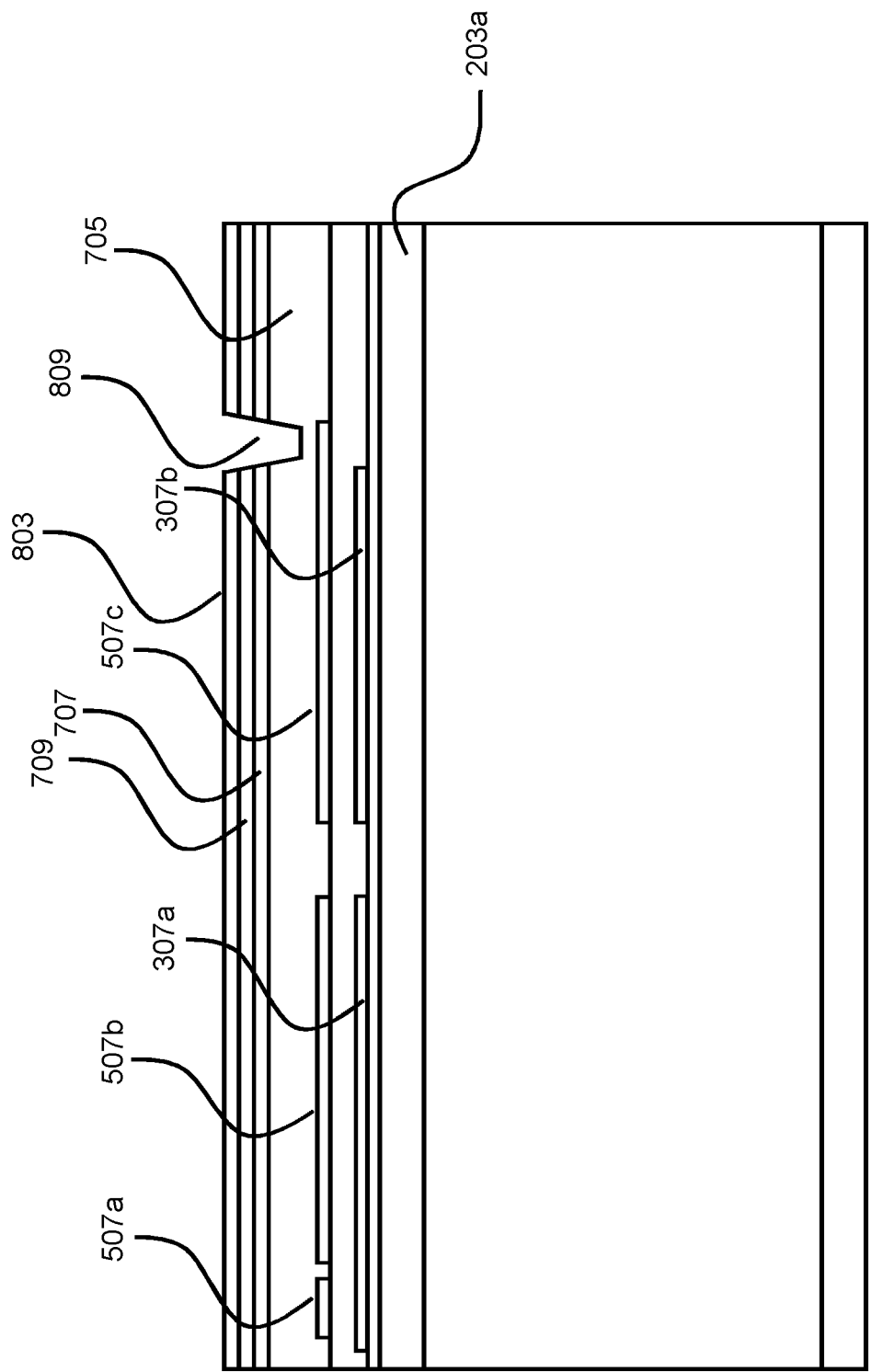

Adverting to FIG. 8, a hardmask 803 can be formed on the passivation layer 709 to a thickness of 10 nm to 500 nm. The hardmask 803 can be formed of, for example, plasma tetra ethyl oxysilane (PTEOS). Next, a first via 809 can be formed. The first via 809 can be formed by etching through the hardmask 803, through the passivation layer 709, through the third metal thin film 707 and partially through the second device layer 705.

Figure 9:
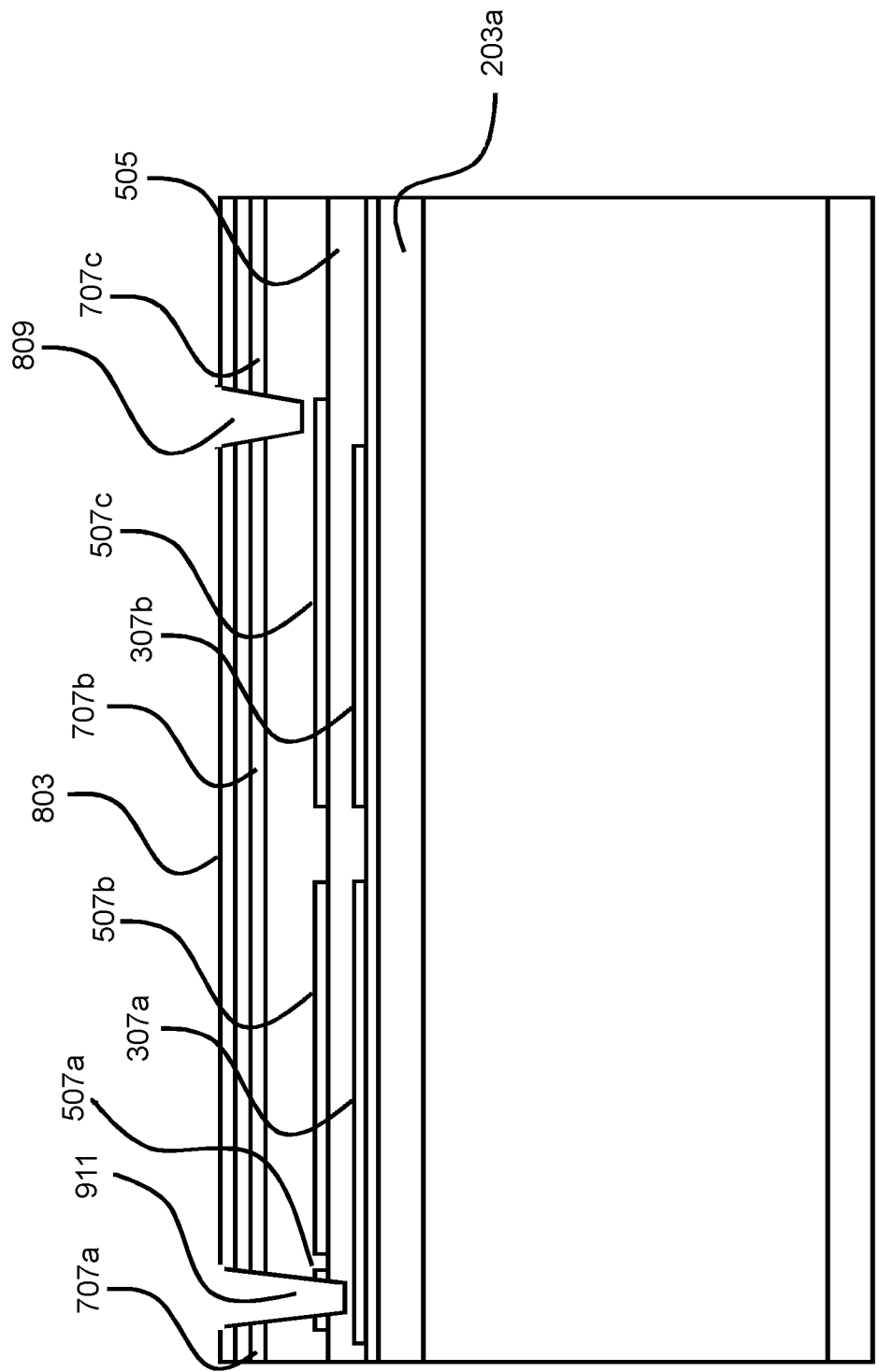

As illustrated in FIG. 9, a second via 911 can be formed. The second via 911 may be formed by etching through the hardmask 803, the passivation layer 709, the third metal thin film 707, the second device layer 705, metal thin film section 507a and partially through the first device layer 505. As a result of forming the first and second vias 809 and 911, the third metal thin film 707 is divided into a first section 707a, a second section 707b and a third section 707c.

Figure 10:
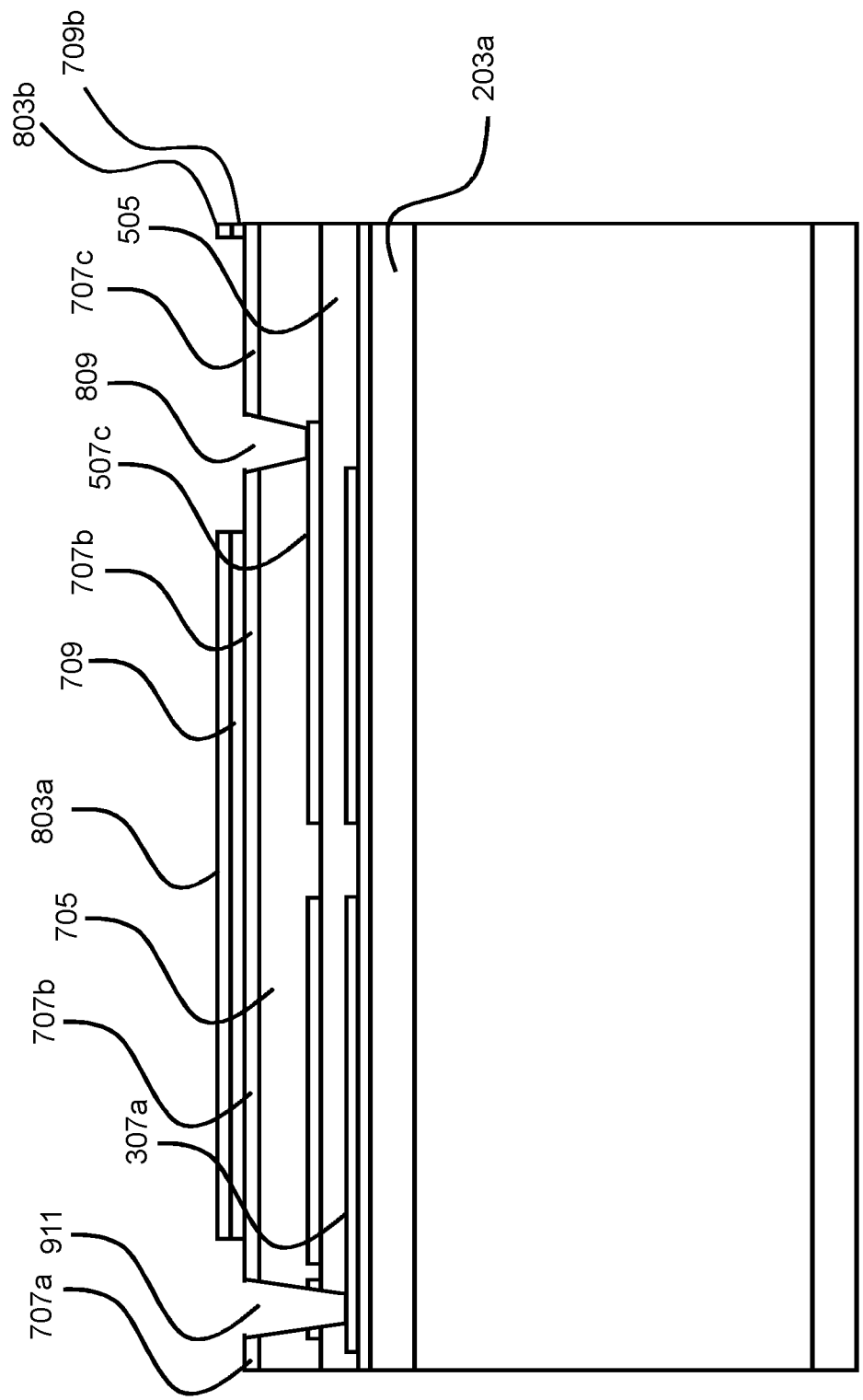

Adverting to FIG. 10, using a mask (not shown for illustrative convenience), portions of the hardmask 803 around the first and second vias 809 and 911 are etched down to the passivation layer 709. A wet etch is then performed to extend the first via 809 down to metal thin film section 507c and to extend the second via 911 down to metal thin film section 307a. This process exposes portions of metal thin film sections 707a and 707b surrounding the via 911 and portions of metal thin film sections 707b and 707c surrounding the first via 809. As a result, the hardmask 803 can be separated into sections 803a and 803b while the passivation layer 709 can be separated into sections 709a and 709b.

During this etching process the first device layer 505, second device layer 705, and passivation layer 709 can be etched with another etching process different from the etching process used to remove the hardmask 803. For example, wet etching the first device layer 505, second device layer 705 and 705' can be performed by using a tetramethyl ammonium hydroxide (TMAH) based developer. As a result, sections of the passivation layer 709 including sections 709a and 709b remain on metal thin film sections 707b and 707c, respectively, and sections 803a and 803b of the hardmask 803 remain on sections 709a and 709b of the passivation layer 709, respectively. Sections 803a and 709a are of the same length and sections 803b and 709b are also of the same length, as illustrated in FIG. 10. However, sections 803a and 709a and sections 803b and 709b can vary in length.

Figure 11:
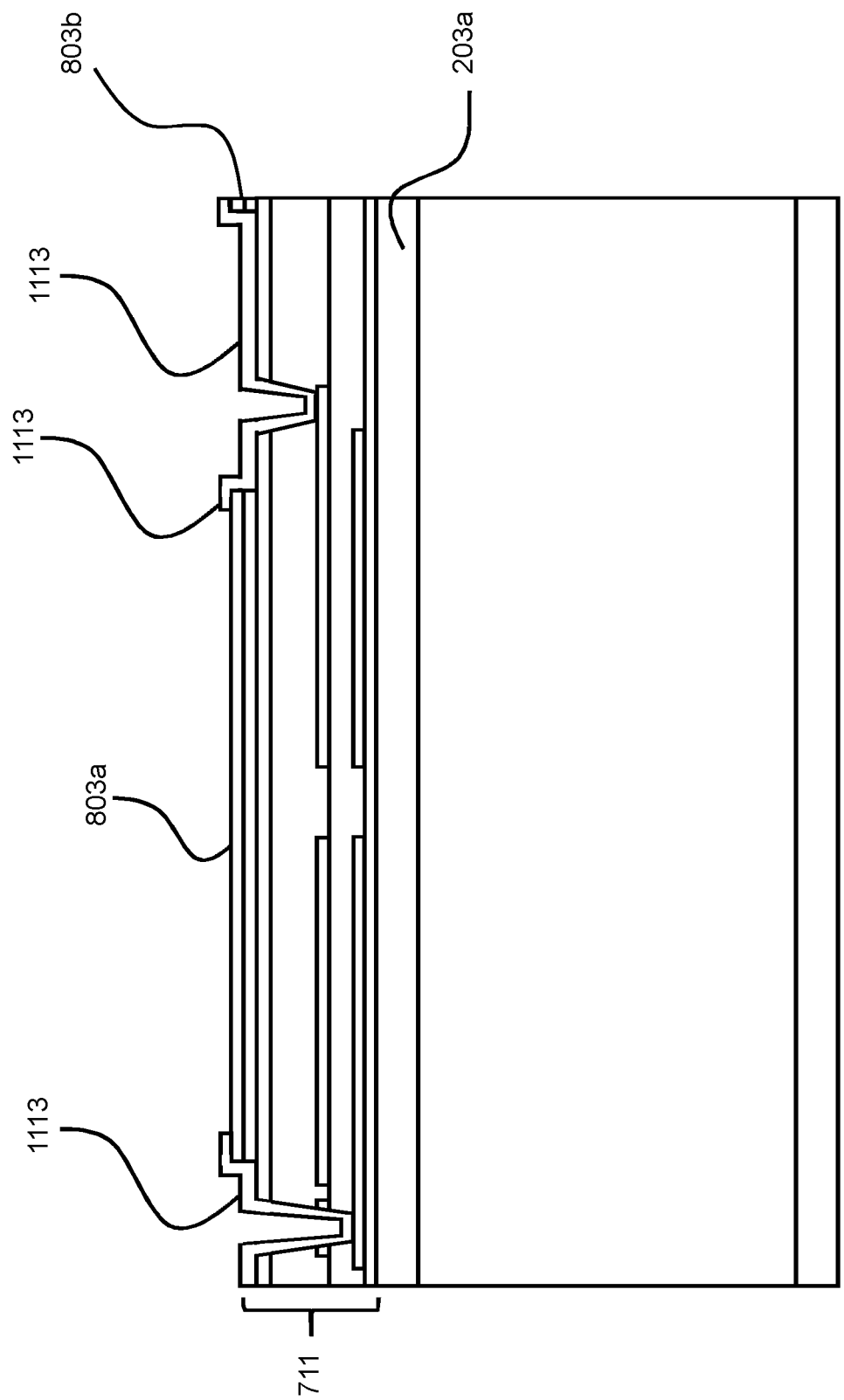

As illustrated in FIG. 11, a pad layer 1113 can be formed in the vias 809 and 911 and over the surface of the membrane 711 including section 803a and section 803b. The pad layer 1113 can be formed of, for example, AlCu. The pad layer 1113 is formed to a thickness of 0.1 micro-meter (μm) to 0.2 μm. The pad layer 1113 can be formed by a deposition process.

Next, while outer edges of hardmask section 803a are masked and section 803b is masked the rest of the hardmask section 803a remains exposed. Using the mask, the pad 1113 is removed only from the exposed portion of hardmask section 803a. The pad 1113 can be removed, for example, by an etching process.

Figure 12:
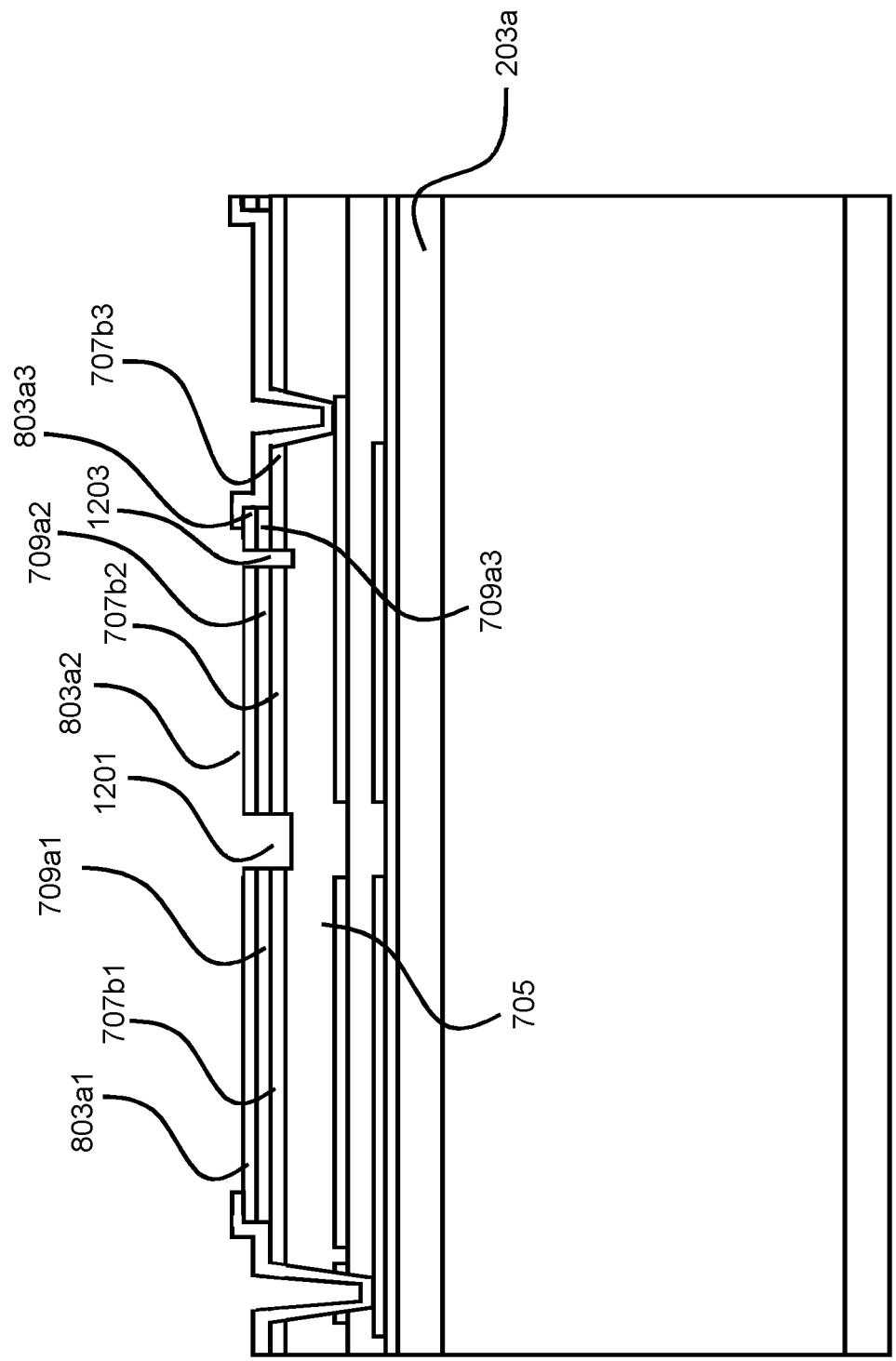

Adverting to FIG. 12, the hardmask 803 is patterned to expose a first portion of hardmask section 803a and a second portion of hardmask section 803a. Then the exposed first and second portions of the hardmask section 803a are removed. As a result, portions of the passivation layer 709a and portions of metal thin film section 707b directly under the removed first and second portions of the hardmask section 803a are also removed, leaving a gap 1201 and a gap 1203 exposing the second device layer 705. This removal process can be performed, for example, by an etching process. As a result of this removal process, the passivation layer 709a is separated into section 709a1, section 709a2 and section 709a3. In addition, section 803a of the hardmask is separated into section 803a1, section 803a2 and section 803a3, and thin film section 707b is further separated into section 707b1, section 707b2 and section 707b3.

Figure 13:
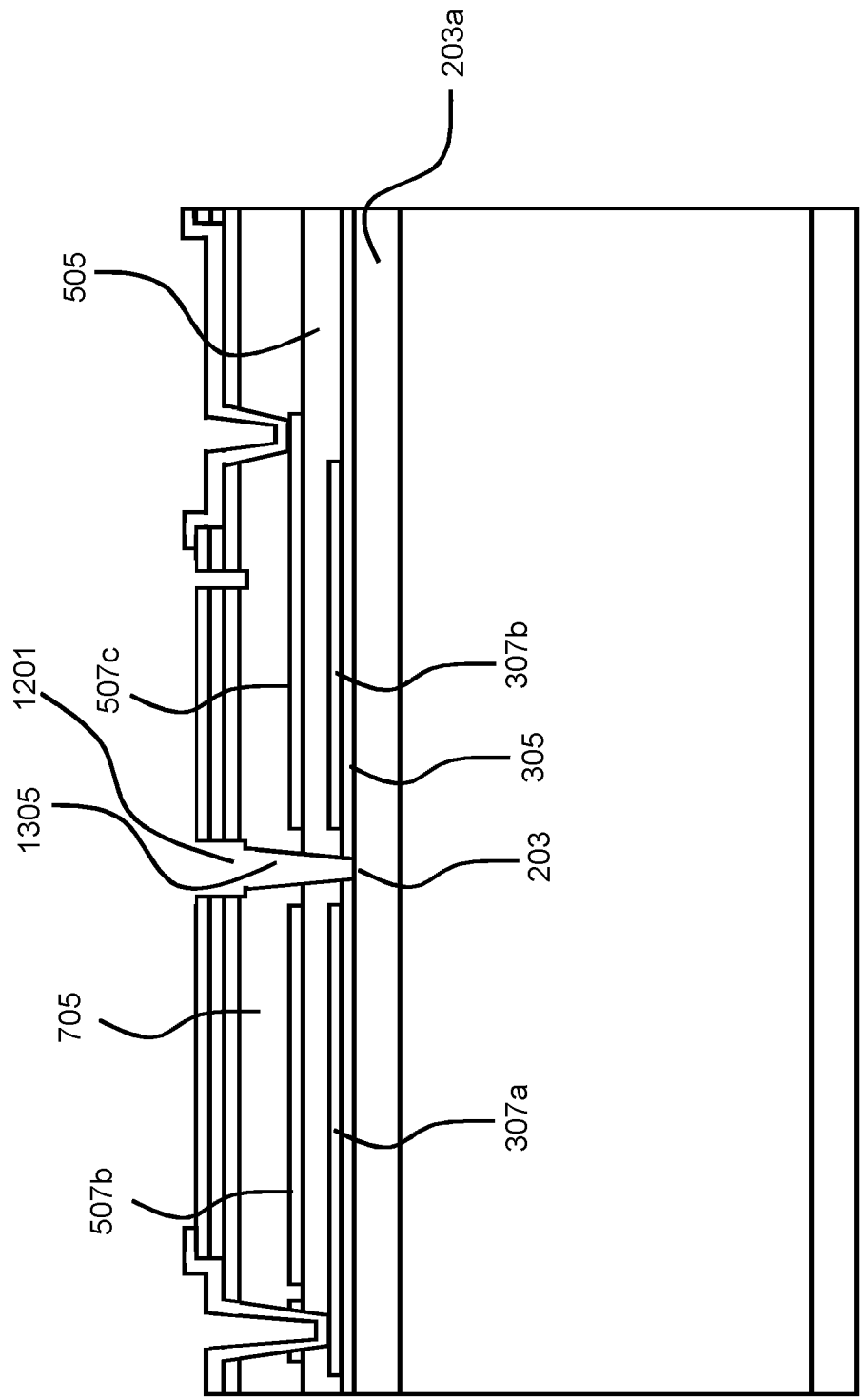

Adverting to FIG. 13, section 803a1, section 803a2 and section 803a3 are patterned to expose the gap 1201. Then a trench 1305 can be formed within the gap 1201 down to the oxide layer 203. More specifically, the trench 1305 can extend through the second device layer 705, between metal thin film sections 507b and 507c, through the first device 505, between the metal thin film sections 307a and 307b and through the seed layer 305.

Figure 14:
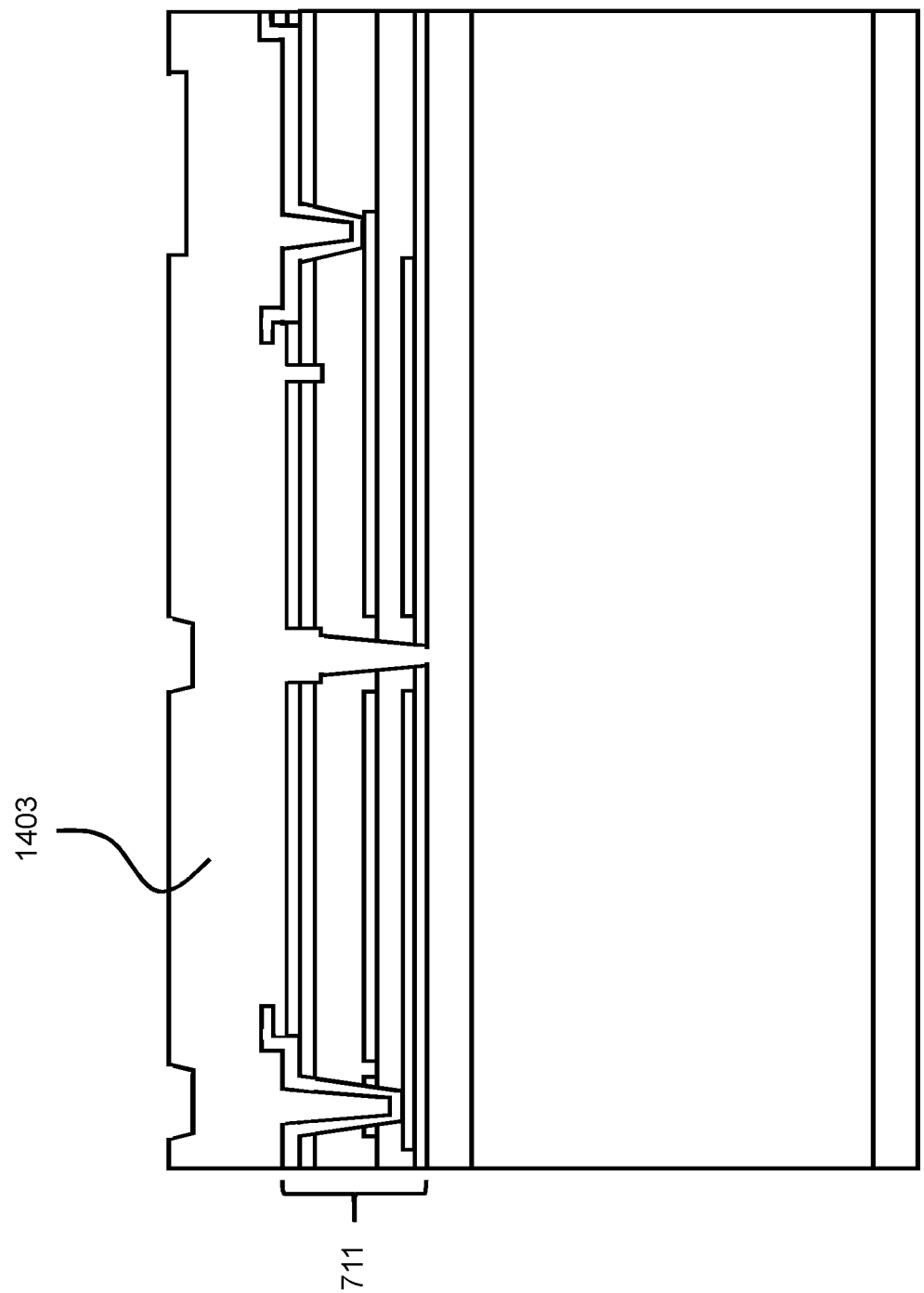

Adverting to FIG. 14, a second hardmask 1403 can be formed in the vias 809 and 911 and the trench 1305 and over the entire surface of the membrane 711 to a thickness of 1 μm to 5 μm. This second hardmask 1403 can be formed, for example, by a deposition process.

Figure 15:
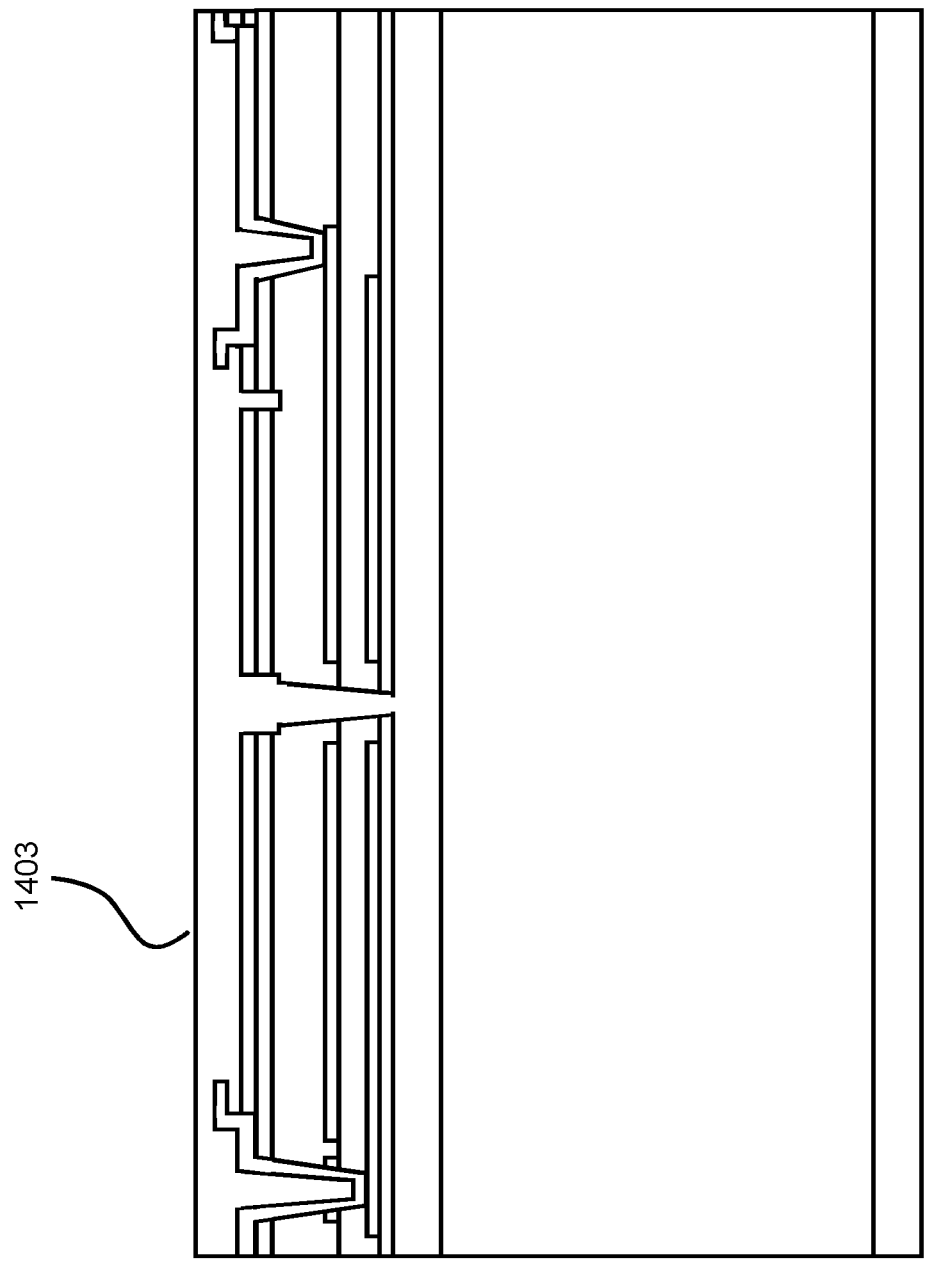

Adverting to FIG. 15, the second hardmask 1403 is reduced to a thickness of 100 nm to 1000 nm. When the hardmask 1403 is formed of PTEOS, it can be reduced by an oxide planarization process. The oxide planarization process can be performed, for example, by chemical-mechanical planarization (CMP) or an etch back process.

Figure 16:
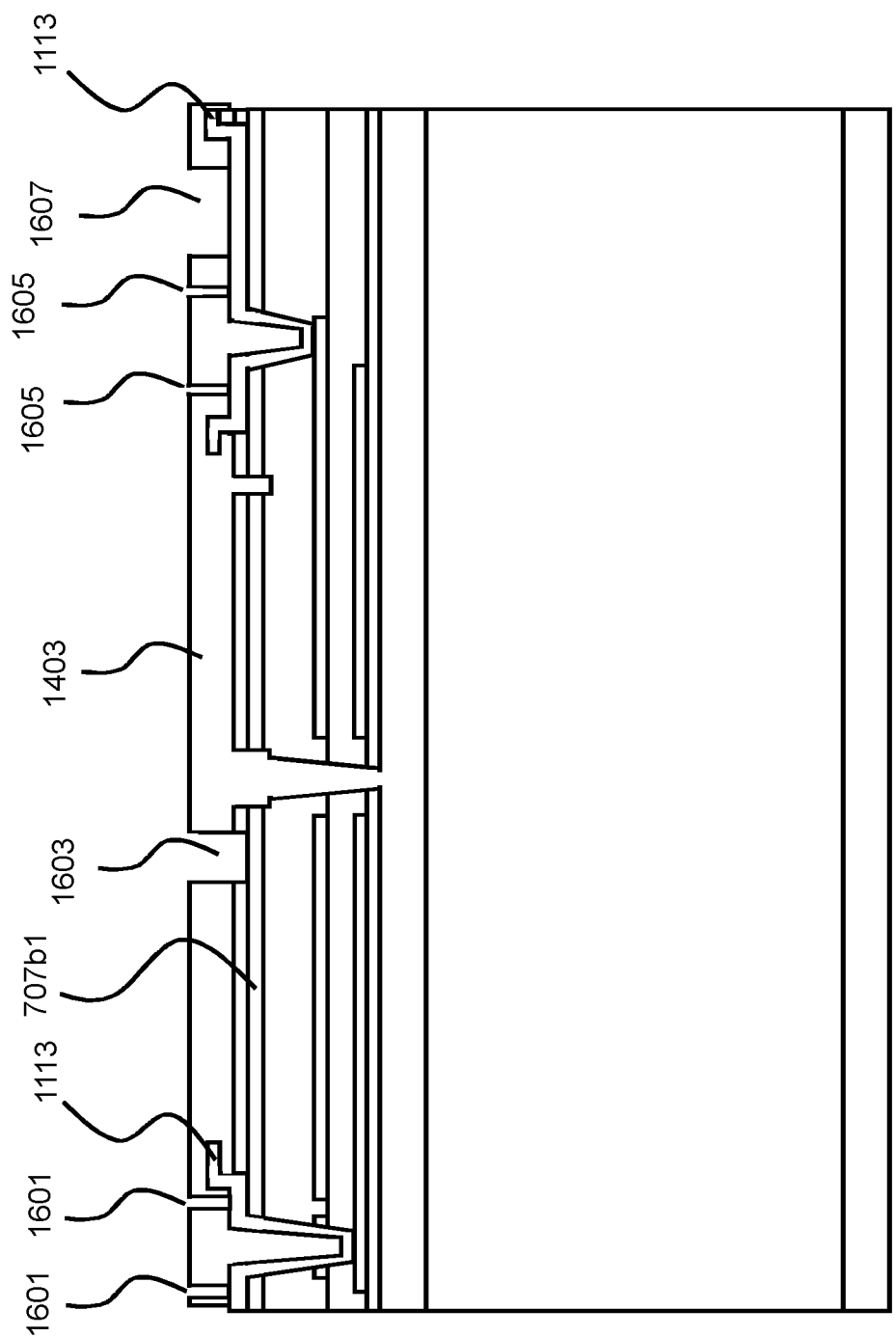

Adverting to FIG. 16, the second hardmask 1403 is patterned to expose a plurality of areas therein. The exposed areas of the second hardmask 1403 are then removed to form gaps 1601, 1603, 1605 and 1607. Gaps 1601 and 1605 surround the first and second vias, respectively. The exposed areas can be removed by an etching process. Gaps 1601 and 1605 extend down to the pad 1113, gap 1603 extends down to thin film section 707b1, and gap 1607 extend down to the pad layer 1113. The exposed areas of the second hardmask 1403 can be removed to form the gaps the 1601, 1603, 1605 and 1607 by an etching process.

Adverting to FIG. 17, a pad layer 1713 can be formed over the second hardmask 1403 and in the gaps 1601, 1603, 1605 and 1607 to cover entire membrane 711 (portions of pad layer 1713 are not shown to illustrate the etching process described below). The pad layer 1713 can be formed using a metal pattern (not shown for illustrative convenience). The pad layer 1713 is formed to a thickness of 200 nm to 2000 nm. Then another mask (not shown for illustrative convenience) is used to remove part of the pad layer 1713 down to the second hardmask 1403. As a result of this selective removal using the mask, four pad layer structures 1715, 1717, 1719 and 1721 remain extending above the second hardmask 1403. The mask used here can be a metal pattern mask that is applied to provide for etching grooves 1717a and 1721a in the second and fourth structures 1717 and 1721.

Figure 17:
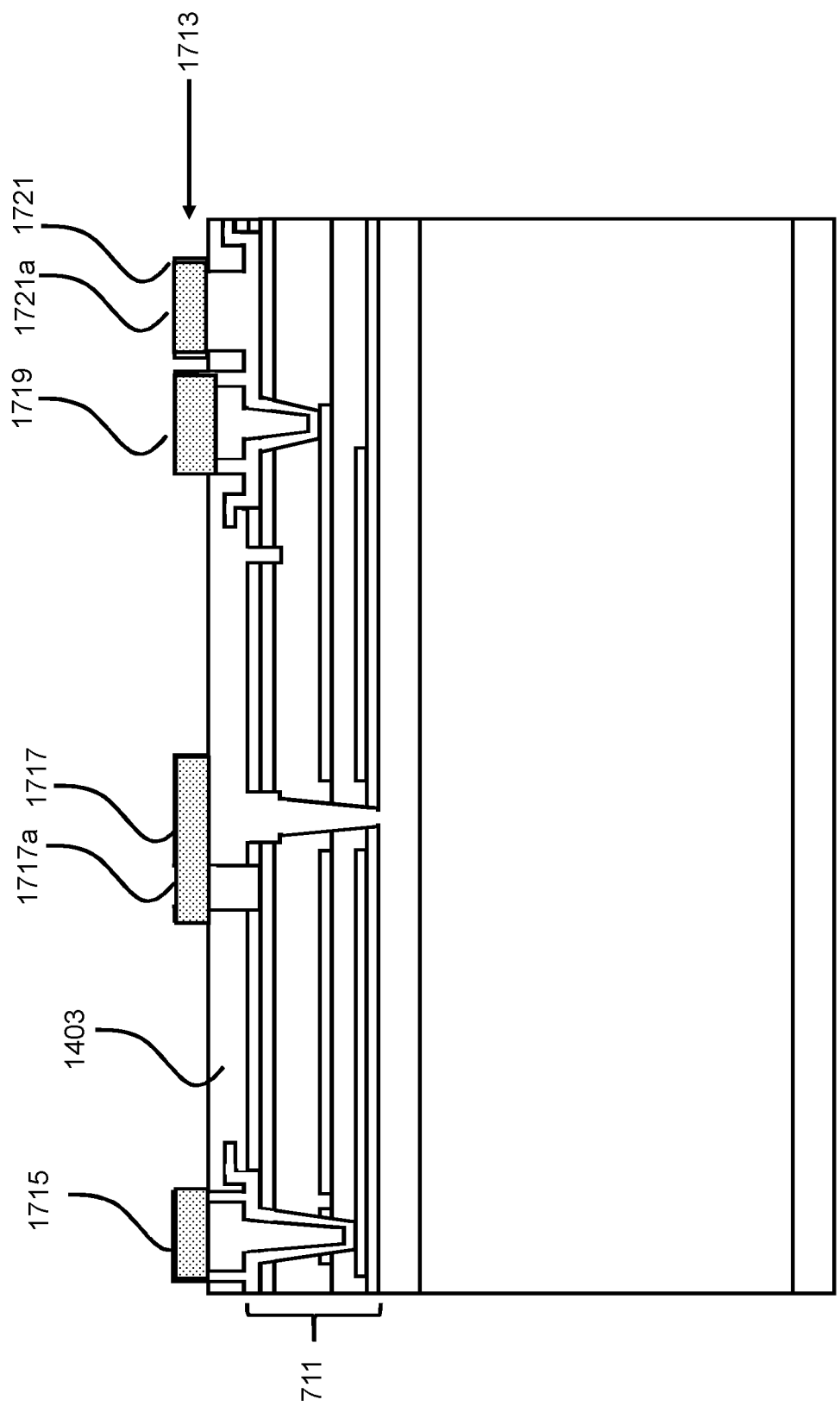
Figure 18:
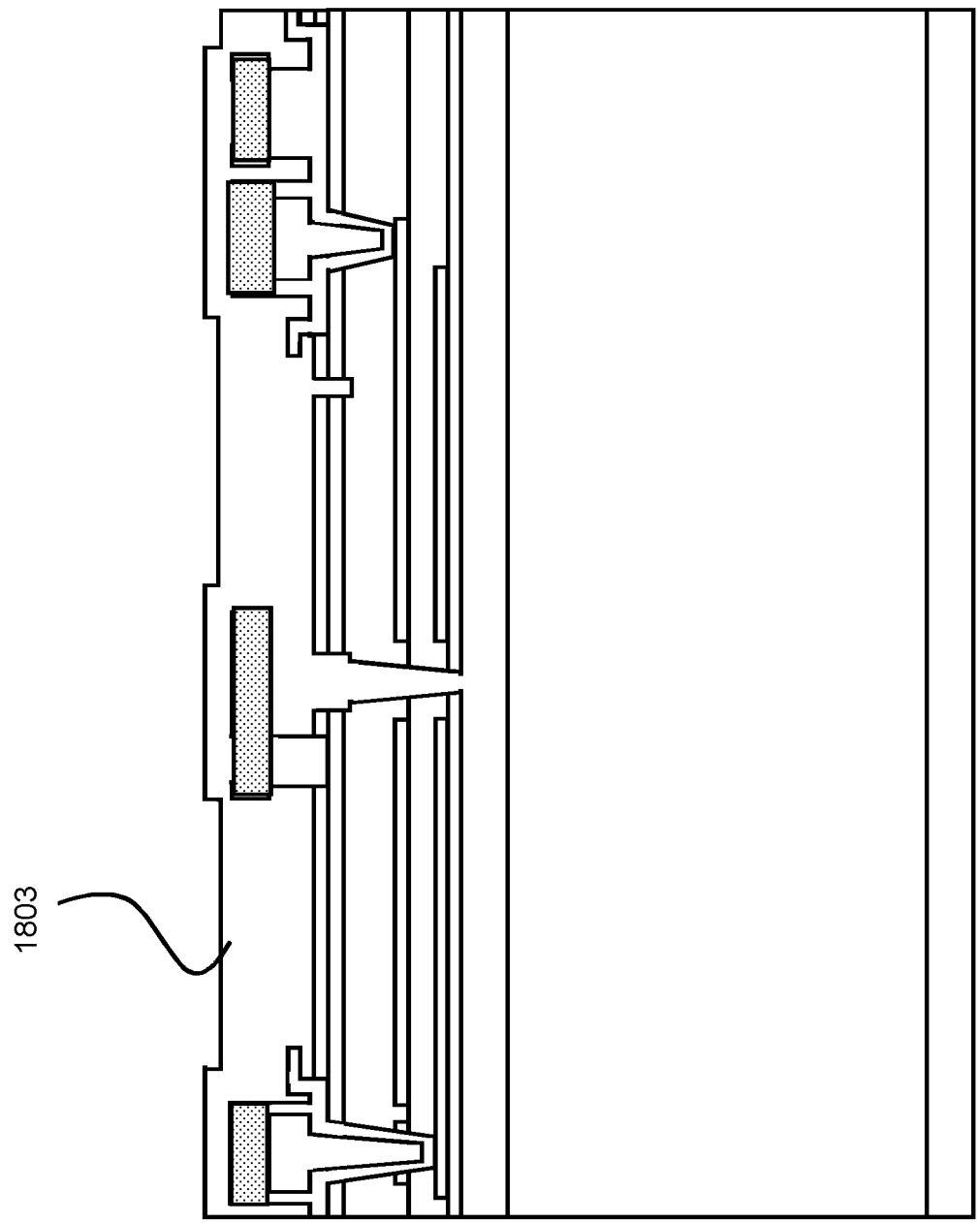

As illustrated in FIG. 18, a hardmask 1803 is formed over the entire front surface of the structure illustrated in FIG. 17. The hardmask 1803 is formed to a thickness of 1 μm to 5 μm and can be formed of an oxide such as PTEOS. The hardmask 1803 can be formed, for example, by sputter deposition process.

Figure 19:
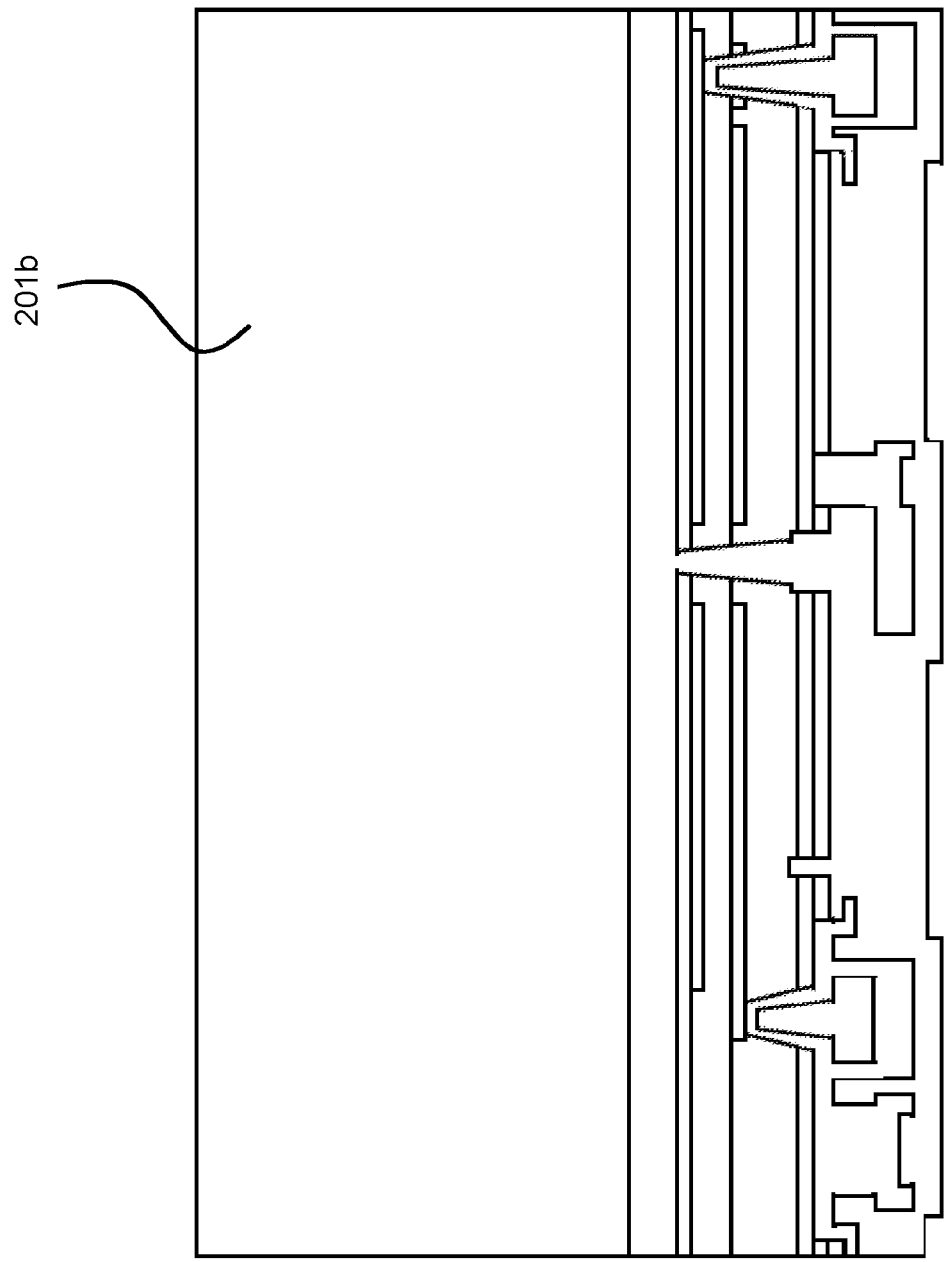

Adverting to FIG. 19, while the front side of the structure (the hardmask 1803) is taped (not shown for illustrative convenience), the oxide layer 203 on the back side of the Si 201b (see FIG. 2) is removed and the remaining silicon 201, from the back side 201b, is thinned to a thickness of 300 um to 400 μm. The oxide layer 203 and part of the Si 201 can be removed by a CMP process. After part of the Si is removed from the back side 201b, another mask can be formed over the back of the Si 101b to expose a portion thereof.

Figure 20:
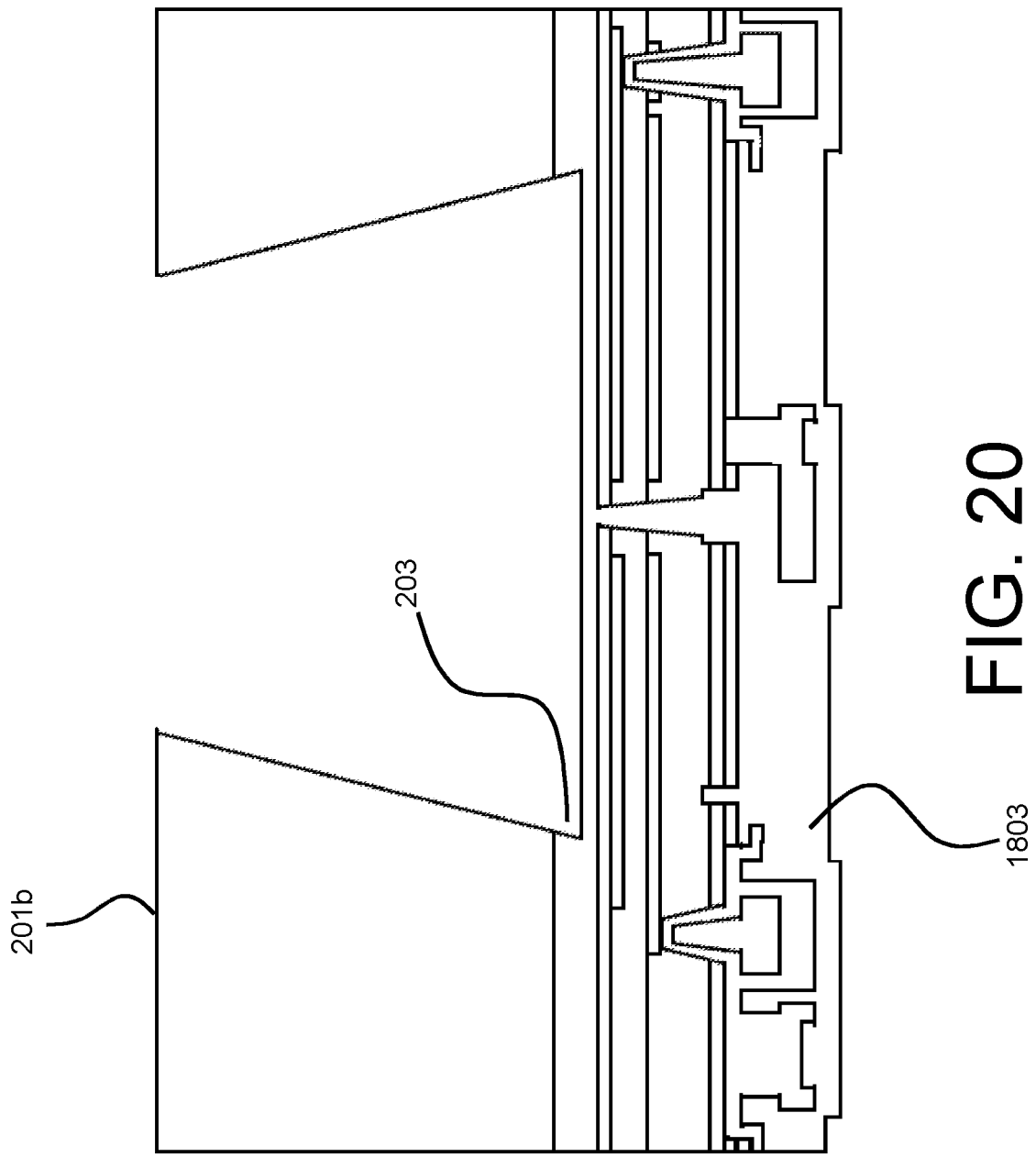

Adverting to FIG. 20, the exposed portion of the Si 201b is etched to the oxide layer 203 on the front side of the Si 201a or partially gouging into the oxide layer 203.

Figure 21:
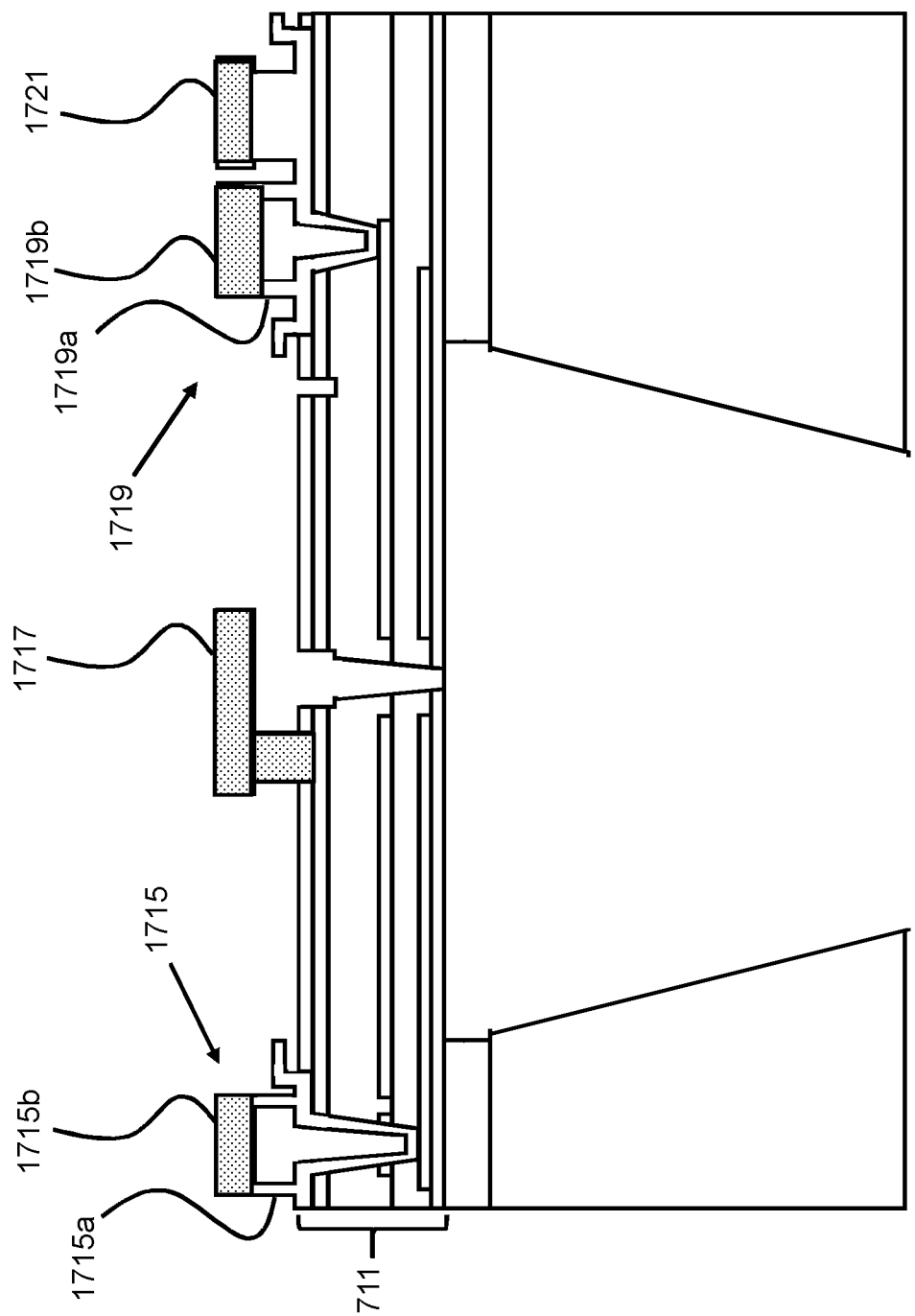

Adverting to FIG. 21, the hardmask 1403 is removed to result in a piezoelectric microphone with an interlock/stopper structure 1717 as well as a first seal ring 1715a and cap 1715b structure 1715 and a second seal ring 1719a and cap 1719b structure 1719 and a bond pad 1721. The hardmask 1403 can be removed by using, for example, a vapor hydrofluoric (VHF) acid step, which can remove silicon and oxide from around metal parts. The seal ring and cap structures 1715 and 1719 formed as described above, with the hardmask formed therein, protects the vias and the thin film layers connected thereto from vapor hydrofluoric acid etching when removing the hardmask, and also protects the vias from the environment around them during operation.

Adverting to FIG. 22, according to another embodiment of the present disclosure, during the application of the mask applied over hardmask 803 (described above with reference to FIG. 10), an alternative mask with an additional exposed portion of section 803a can be applied. Then during the process of removing the exposed portion of section 803a surrounding the first via 809 and the second via 911, and removing the portion of section 709a disposed under the exposed portions of section 803a, and removing the exposed portion of section 803a surrounding the second via 911 and the portion of section 709a thereunder, as described above and illustrated in FIG. 10, and prior to depositing the pad layer 1113 as illustrated in FIG. 11, a bump gap 2205 can be formed in the additional exposed portion of the hardmask section 803a and the portion of second 709a thereunder.

More specifically, during the etching process of vias 809 and 911 as described above with reference to FIG. 10, an additional exposed portion of section 803a can be removed with a portion of section 709a disposed thereunder to expose a portion of section 707b, leaving the bump gap 2505. Then a mask can be applied to form a bump pattern in the bump gap 2505. Next, during the deposition of the pad layer 1113, as described above with reference to FIG. 11, the bump gap 2205 with the mask bump pattern disposed thereover is also filled with the pad layer 1113 to a thickness of 0.1 to 0.2 μm, thus forming micro-bumps 2207 in the bump gap 2205.

Adverting to FIG. 23, in accordance with the embodiment described with reference to FIG. 22, the resulting piezoelectric microphone of FIG. 21 will also include a micro-bump structure 2207 disposed underneath the interlock/stopper structure 1717 to prevent potential stiction of the interlock/stopper structure 1717 and membrane 711 during operation of the device.

Figure 24:
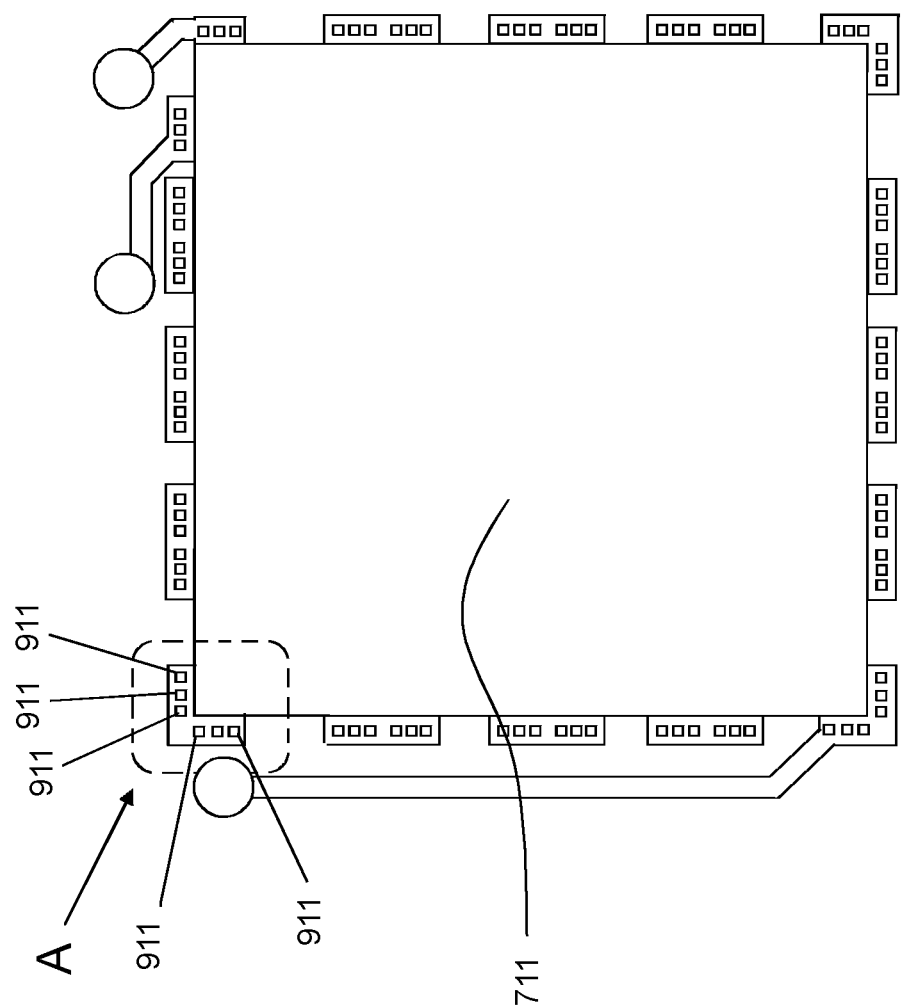
FIG. 24 illustrates a top view of a membrane and vias of a piezoelectric microphone according to an exemplary embodiment of the present disclosure.

FIG. 24 illustrates a top view of an example of a membrane 711 and vias (i.e., 911) of a piezoelectric microphone according an embodiment of the present disclosure.

Figure 25C:
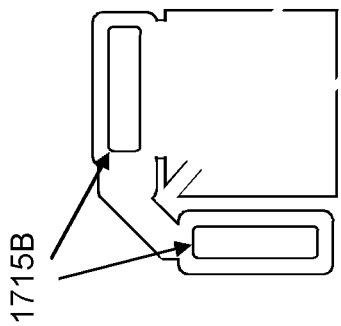
FIG. 25C illustrates another view of FIG. 25B with metal caps disposed over the seal rings to form a seal ring/metal cap structure.
Figure 25B:
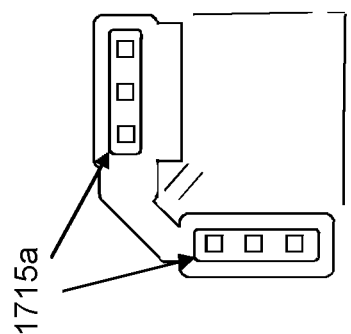
FIG. 25B illustrates another view of FIG. 25A with seal rings disposed around the vias.
Figure 25A:
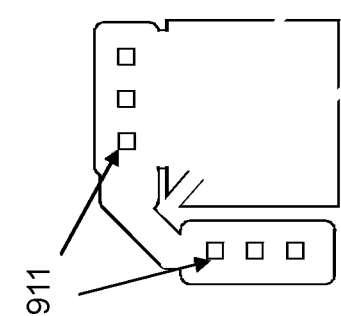
FIG. 25A illustrates an enlarged top view of a portion of FIG. 24 illustrating the vias.

FIG. 25A illustrates an enlarged top view of a portion of FIG. 24 within the dotted line box A showing the vias (i.e., via 911) before a seal ring and metal cap structure are provided thereon.

FIG. 25B illustrates another view of FIG. 25A with seal rings (i.e., 1715a) disposed around the vias (i.e., 911).

FIG. 25C illustrates another view of FIG. 25B with metal caps (i.e., 1715b) disposed over the seal rings (i.e., 1715a) to form the seal ring and metal cap structure (i.e., 1715).

The embodiments of the present disclosure can achieve several technical effects, including providing a piezoelectric microphone with a released device deflection mismatch that can be controlled to be less than a gap thickness between a membrane and an interlock/stopper, preventing potential stiction of the microphone during operation, and defining a gap between an interlock/stopper and a membrane while using less hardmasks to target the gap thickness. The present disclosure enjoys industrial applicability in any of acoustic leakage probes and in aeroacoustic tests, as well as many other uses not confined to air.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a structure including a silicon (Si) layer and a sacrificial oxide layer on one side of the Si layer and a membrane having a seed layer, metal thin films, device layers, a passivation layer and a trench through the middle thereof;
   first and second seal ring and cap structures extending into the membrane and separated by a predetermined distance;
   a trench extending through the membrane between the first and second seal structures;
   a bond pad adjacent to and in contact with the second seal ring and cap structure; and
   an interlock/stopper extending from the membrane between the trench and the first seal ring and cap structure, over an opening of the trench and over a portion of the membrane.

2. The device according to claim 1, wherein the portion of the interlock/stopper extending over the membrane is separated from the membrane by a gap of 0.1 μm to 0.5 μm.

3. The device according to claim 2, further comprising:
   a bump structure extending from the membrane and disposed under the interlock/stopper structure between the trench and the second seal ring and cap structure.

4. The device according to claim 3, wherein:
   the first seal ring and cap structures extend through the passivation layer, a third metal thin film and a first section of a second metal thin film to contact a first section of a first metal thin film, the seal ring and cap structure having an oxide disposed therein, and
   the second seal ring and cap structure extends through the passivation layer and the third metal thin film to extend to a third section of the second metal thin film.

5. The device according to claim 1, wherein:
   the first and second seal ring and cap structures are formed to a thickness of 200 nm to 2000 nm and are formed of aluminum copper (AlCu), and
   the bump structure is formed of AlCu and has a thickness of 0.1 μm to 0.2 μm.

* * * * *